(12) United States Patent
Xie et al.

(10) Patent No.: US 12,471,364 B2
(45) Date of Patent: Nov. 11, 2025

(54) HYBRID STACKED FIELD EFFECT TRANSISTORS

(71) Applicant: International Business Machines Corporation, Armonk, NY (US)

(72) Inventors: Ruilong Xie, Niskayuna, NY (US); Bahman Hekmatshoartabari, White Plains, NY (US); Alexander Reznicek, Troy, NY (US); Heng Wu, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 1052 days.

(21) Appl. No.: 17/481,504

(22) Filed: Sep. 22, 2021

(65) Prior Publication Data
US 2023/0085628 A1   Mar. 23, 2023

(51) Int. Cl.
*H10D 84/85* (2025.01)
*H10D 30/01* (2025.01)
(Continued)

(52) U.S. Cl.
CPC ......... *H10D 84/856* (2025.01); *H10D 30/031* (2025.01); *H10D 30/6713* (2025.01);
(Continued)

(58) Field of Classification Search
CPC ............... H10D 84/856; H10D 30/031; H10D 30/6713; H10D 30/6733; H10D 30/6735;
(Continued)

(56) References Cited

U.S. PATENT DOCUMENTS

| 9,991,352 B1 | 6/2018 | Frougier et al. |
| 10,014,390 B1 | 7/2018 | Bouche et al. |

(Continued)

FOREIGN PATENT DOCUMENTS

| CN | 105280502 A | 1/2016 |
| JP | 2024-535717 A | 10/2024 |
| WO | 2023/045554 A1 | 3/2023 |

OTHER PUBLICATIONS

Ryckaert et al., "The Complementary FET (CFET) for CMOS scaling beyond N3" 2018 IEEE Symposium on VLSI Technology (Jun. 2018) pp. 141-142.

(Continued)

*Primary Examiner* — Jerome Leboeuf
(74) *Attorney, Agent, or Firm* — Cantor Colburn LLP; Samuel Waldbaum

(57) ABSTRACT

A hybrid stacked semiconductor device includes a nanosheet stack on a substrate and an all-around gate. The nanosheet stack includes a first stack portion and a second stack portion. The first stack portion includes first channels. The second stack portion is stacked on the first stack portion, and includes second channels. The all-around gate includes a first gate portion that wraps around the first channels and a second gate portion that wraps around the second channels. A first gate extension contacts the first gate portion and the second gate extension contacts the second gate portion. At least one gate contact contacts the first gate extension to establish conductivity with the first gate portion and contacts the second gate extension to establish conductivity with the second gate portion.

11 Claims, 20 Drawing Sheets

(51) Int. Cl.
   *H10D 30/67* (2025.01)
   *H10D 62/10* (2025.01)
   *H10D 84/01* (2025.01)
   *H10D 84/03* (2025.01)

(52) U.S. Cl.
   CPC ..... *H10D 30/6733* (2025.01); *H10D 30/6735* (2025.01); *H10D 30/6757* (2025.01); *H10D 62/118* (2025.01); *H10D 84/017* (2025.01); *H10D 84/0172* (2025.01); *H10D 84/0186* (2025.01); *H10D 84/0188* (2025.01); *H10D 84/038* (2025.01)

(58) Field of Classification Search
   CPC ............. H10D 30/6757; H10D 62/118; H10D 84/017; H10D 84/0172; H10D 84/0186; H10D 84/0188; H10D 84/038; H10D 64/252; H10D 62/221; H10D 84/144; H10D 84/903; H10D 30/689; H10D 48/071; H10D 84/135; H10D 84/201; H02K 15/027; B65D 83/141; A61K 40/4218; H10F 19/33; H10F 19/908; H10F 77/955; A01G 13/33; A23B 2/783; C01G 53/82; H10H 20/826; B82Y 10/00
   See application file for complete search history.

(56) References Cited

U.S. PATENT DOCUMENTS

| | | |
|---|---|---|
| 10,192,819 B1 | 1/2019 | Chanemougame et al. |
| 10,192,867 B1 | 1/2019 | Frougier et al. |
| 10,217,817 B2 | 2/2019 | Chang et al. |
| 10,483,166 B1 | 11/2019 | Cheng et al. |
| 10,510,622 B1 | 12/2019 | Frougier et al. |
| 10,692,991 B2 | 6/2020 | Chanemougame et al. |
| 11,315,938 B1* | 4/2022 | Reznicek ............... H10B 20/36 |
| 2016/0020305 A1* | 1/2016 | Obradovic ........... H10D 48/383 438/157 |
| 2019/0181224 A1 | 6/2019 | Zhang et al. |
| 2019/0214459 A1 | 7/2019 | Cheng et al. |
| 2020/0035569 A1* | 1/2020 | Frougier ............ H10D 84/0188 |
| 2020/0105751 A1* | 4/2020 | Dewey ................. H10D 62/235 |
| 2020/0111789 A1 | 4/2020 | Li et al. |
| 2020/0111798 A1 | 4/2020 | Paul et al. |
| 2020/0286900 A1 | 9/2020 | Mann et al. |
| 2020/0365469 A1* | 11/2020 | Yamashita .......... H01L 21/3086 |
| 2021/0265345 A1 | 8/2021 | Xie et al. |
| 2023/0395432 A1* | 12/2023 | Chen ...................... H10D 30/43 |

OTHER PUBLICATIONS

International Search Report; International Application No. PCT/CN2022/108564; International Filing Date: Jul. 28, 2022; Date of mailing: Oct. 10, 2022; 9 pages.

* cited by examiner

HYBRID STACKED FIELD EFFECT TRANSISTORS

BACKGROUND

The present invention relates in general to fabrication methods and resulting structures for semiconductor devices. More specifically, the present invention relates to fabrication methods and resulting structures for hybrid stacked field effect transistors.

In contemporary semiconductor device fabrication processes, a large number of semiconductor devices, such as n-type field effect transistors (NFETs) and p-type field effect transistors (PFETs), are fabricated on a single wafer. Non-planar transistor device architectures (e.g., fin-type FETs (FinFETs) and nanosheet FETs) can provide increased device density and increased performance over planar transistors. In contrast to conventional planar FETs, non-planar FETs utilize gate-all-around (GAA) technologies to implement a gate stack that wraps around the full perimeter of the channel regions. The resulting GAA FET has a reduced device footprint and improved control of channel current flow.

One type of non-planar FET recently developed is referred to as a complementary field-effect transistors (CFET). A CFET includes a PFET vertically stacked on top of an NFET or vice versa. The CFET can utilize GAA technology when stacking PFET and NFET transistor on top of each other to permit a smaller scaled device, which achieves the continued trend of reducing the footprint of semiconductor devices. However, not all the circuit components are made of CMOS pairs, CFET device which provide a pair of devices with different polarity (PFET over NFET or NFET over PFET) does not provide enough flexibility in circuit design. Thus, a hybrid stacked FET solution with flexible gate controls is attractive for various types of circuits.

SUMMARY

Embodiments of the present invention are directed to a method of performing fabrication operations to form a hybrid stacked semiconductor device. The fabrication operations include forming a nanosheet stack on a substrate, the nanosheet stack comprising a first stack portion including first channels, a second stack portion stacked on the first stack portion, the second stack portion including second channels, and a dielectric spacer interposed between the first stack portion and the second stack portion. The operations further comprise forming an all-around gate including a first gate portion that wraps around the first channels and a second gate portion that wraps around the second channels. The operations further comprise forming a first gate extension on a first side of the nanosheet stack to contact the first gate portion and forming a second gate extension on a second side of the nanosheet stack to contact the second gate portion. The second side is different from the first side. The operations further comprise forming a first gate contact that contacts the first gate extension to establish conductivity with the first gate portion and forming a second gate contact that contacts the second gate extension to establish conductivity with the second gate portion.

Embodiments of the present invention are directed to a method of performing fabrication operations to form a hybrid stacked semiconductor device. The fabrication operations include forming a nanosheet stack on a substrate. The nanosheet stack comprises a first stack portion including first channels, a second stack portion stacked on the first stack portion, the second stack portion including second channels, and a dielectric spacer interposed between the first stack portion and the second stack portion. The operations further comprise forming an all-around gate including a first gate portion that wraps around the first channels and a second gate portion that wraps around the second channels. The operations further comprise forming a first gate extension on a first side of the nanosheet stack to contact the first gate portion and forming a second gate extension on the same first side of the nanosheet stack to contact the second gate portion. The operations further comprise forming a gate contact that contacts both the first gate extension and the second gate extension to establish conductivity with the first gate portion and the second gate portion.

Embodiments of the present invention are directed to a hybrid stacked semiconductor device. The hybrid stacked semiconductor device comprises a nanosheet stack on a substrate and an all-around gate. The nanosheet stack includes a first stack portion and a second stack portion. The first stack portion includes first channels. The second stack portion is stacked on the first stack portion, and includes second channels. The all-around gate includes a first gate portion that wraps around the first channels and a second gate portion that wraps around the second channels. A first gate extension contacts the first gate portion and the second gate extension contacts the second gate portion. At least one gate contact contacts the first gate extension to establish conductivity with the first gate portion and contacts the second gate extension to establish conductivity with the second gate portion.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 2-15 depict multiple cross-sectional views following various fabrication operations for forming a hybrid stacked semiconductor device including two stacked FETs of the same type having independently controlled gates, in which:

FIG. 2 depicts cross-sectional views of the hybrid stacked semiconductor device after performing various intermediate fabrication operations in accordance with aspects of the present invention;

FIG. 3 depicts cross-sectional views of the hybrid stacked semiconductor device after performing additional fabrication operations in accordance with aspects of the present invention;

FIG. 4 depicts cross-sectional views of the hybrid stacked semiconductor device following additional fabrication operations in accordance with aspects of the present invention;

FIG. 5 depicts cross-sectional views of the hybrid stacked semiconductor device following additional fabrication operations in accordance with aspects of the present invention;

FIG. 6 depicts cross-sectional views of the hybrid stacked semiconductor device following additional fabrication operations in accordance with aspects of the present invention;

FIG. 7 depicts cross-sectional views of the hybrid stacked semiconductor device following additional fabrication operations in accordance with aspects of the present invention;

FIG. 8 depicts cross-sectional views of the hybrid stacked semiconductor device following additional fabrication operations in accordance with aspects of the present invention;

FIG. 9 depicts cross-sectional views of the hybrid stacked semiconductor device following additional fabrication operations in accordance with aspects of the present invention;

FIG. 10 depicts cross-sectional views of the hybrid stacked semiconductor device following additional fabrication operations in accordance with aspects of the present invention;

FIG. 11 depicts cross-sectional views of the hybrid stacked semiconductor device following additional fabrication operations in accordance with aspects of the present invention;

FIG. 12 depicts cross-sectional views of the hybrid stacked semiconductor device following additional fabrication operations in accordance with aspects of the present invention;

FIG. 13 depicts cross-sectional views of the hybrid stacked semiconductor device following additional fabrication operations in accordance with aspects of the present invention; and FIG. 14 depicts cross-sectional views of the hybrid stacked semiconductor device following additional fabrication operations in accordance with aspects of the present invention.

FIGS. 15-19 depict multiple cross-sectional views following various fabrication operations for forming a hybrid semiconductor device including a stacked CMOS FET having a shared gate, in which:

FIG. 15 depicts cross-sectional views of the hybrid stacked semiconductor device after performing various intermediate fabrication operations in accordance with aspects of the present invention;

FIG. 16 depicts cross-sectional views of the hybrid stacked semiconductor device following additional fabrication operations in accordance with aspects of the present invention;

FIG. 17 depicts cross-sectional views of the hybrid stacked semiconductor device following additional fabrication operations in accordance with aspects of the present invention;

FIG. 18 depicts cross-sectional views of the hybrid stacked semiconductor device following additional fabrication operations in accordance with aspects of the present invention; and FIG. 19 depicts cross-sectional views of the hybrid stacked semiconductor device following additional fabrication operations in accordance with aspects of the present invention.

DETAILED DESCRIPTION

Figure 1:
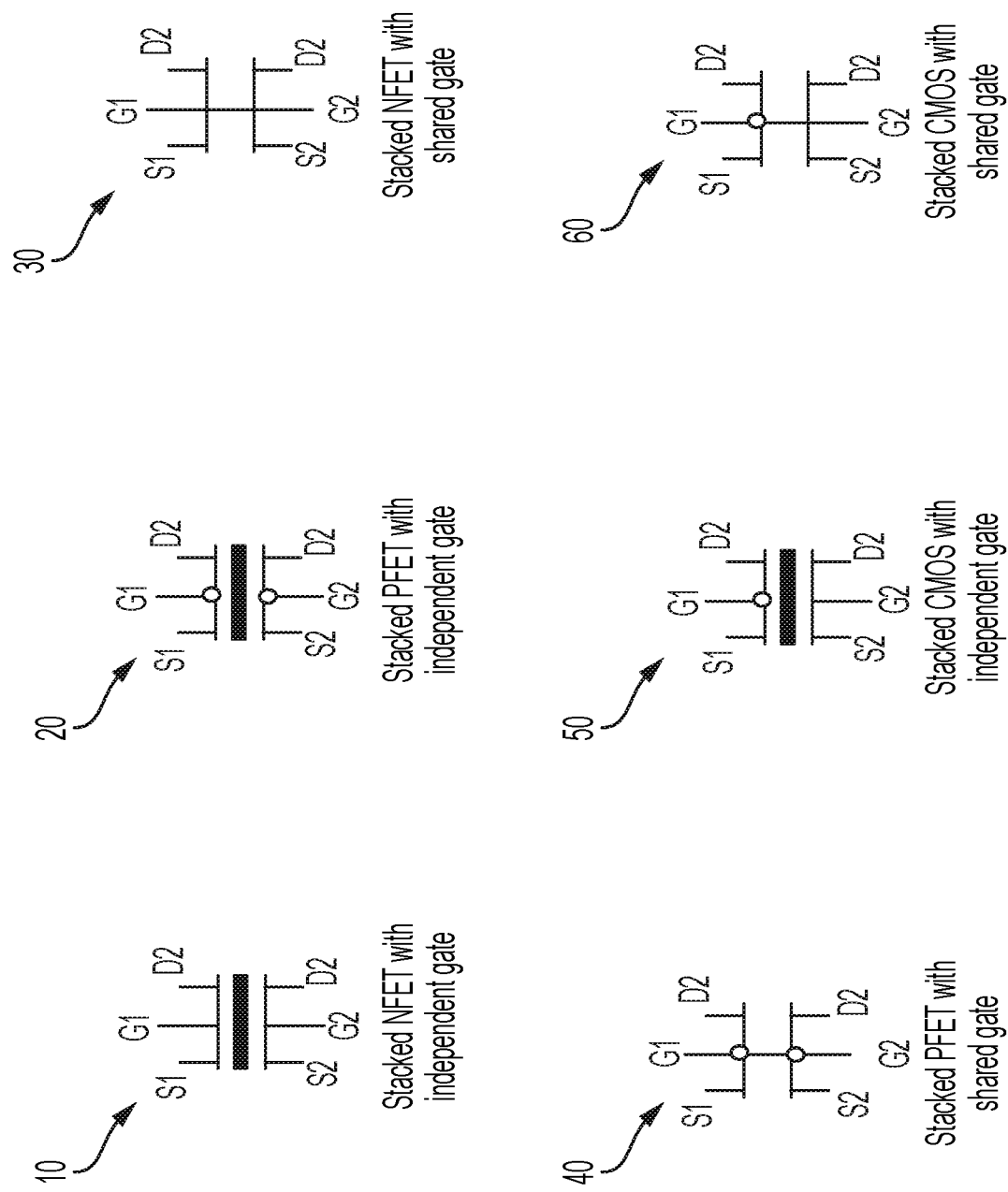
FIG. 1 depicts schematic diagrams of various hybrid stacked semiconductor devices according to embodiments of the present invention.

Although this detailed description includes examples of how aspects of the invention can be implemented to form a wrap-around bottom isolation region in an exemplary gate-all-around (GAA) nanosheet FET architecture having silicon (Si) channel nanosheets and SiGe sacrificial nanosheets, implementation of the teachings recited herein are not limited to a particular type of FET structure or combination of materials. Rather, embodiments of the present invention are capable of being implemented in conjunction with any other type of transistor device or material, now known or later developed, wherein it is desirable to provide improved electrical isolation of the S/D regions and the gate from the underlying substrate.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Typical semiconductor devices are formed using active regions of a wafer. The active regions are defined by isolation regions used to separate and electrically isolate adjacent semiconductor devices. For example, in an IC having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

MOSFET-based ICs are fabricated using so-called complementary metal oxide semiconductor (CMOS) fabrication technologies. In general, CMOS is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel is under better electrostatic control, the FET can be made with a correspondingly smaller wafer footprint. A known method of improving the electrostatic control of channel and decreasing FET size is to form the channel using gate-all-around technologies. For example, FinFET or nanosheet devices form gates that wrap around the channel to improve the gate control. Further, to reduce the footprint of the devices, so-called stacked field effect transistors (FETs) are a next generation device structures that offer scaling gains over previous nanosheet and fin type transistor architectures. Stacked FETs include a first device defining a first type of transistor (e.g., an n-type NS FET) that is vertically stacked above a second device defining a different type of NS transistor (e.g., a p-type NS FET). In this manner, two transistors can share the same device footprint, thereby requiring the space of a single transistor such that device density is doubled.

Although conventional stacked FETs achieve the goal of reducing device footprints, they pose issues in terms of reduced application flexibility. For instance, the two stacked transistors share included in a conventional stacked FET are controlled using the same gate. Therefore, the stacked transistors are referred to as being complementary to each other. Therefore, a conventionally stacked FET is often referred to as a complementary field effect transistor (CFET).

Although conventional CFETs are able to efficiently support CMOS logic circuitry due to their inherent reduction in device footprint along with their complementary and symmetrical transistor relationship, their shared gate limits the applications in which the devices can be utilized. Artificial Intelligence (AI) applications, for example, utilize AI hardware accelerators that employ local register files (LRFs). These register files typically include an imbalanced number of different types of semiconductor devices (e.g., a greater number of total NFET pairs compared to the total number of CMOS FETs) to implement fast static RAMs having dedicated read and write ports. Thus, the complementary and symmetrical architecture characteristics of conventional CFETs (e.g., always including a stacked arrangement of an NFET and PFET) can cause inefficiencies in terms of overall IC footprints. In addition, transistors having independently controlled gates are required to select an individual port of the register file. As a result, CFETs having shared gates are typically impracticable for use in many AI applications.

Turning now to an overview of aspects of the present invention, one or more embodiments of the invention address the above-described shortcomings of known stacked FET architectures and fabrication techniques by providing a hybrid stacked semiconductor device including different types of stacked FETs. Unlike conventional CFETs, however, the hybrid stacked semiconductor device described herein can provide different types of stacked transistors with independently controlled gate for each stacked FET or a shared gate (i.e., a commonly controlled gate) that is shared by the stacked FETS.

Referring to FIG. 1 for example, a non-limiting embodiment of the present invention provides a hybrid stacked semiconductor device 10 that includes a pair of stacked NFETs having independently controlled gates. According to another non-limiting embodiment of the present invention, the hybrid stacked semiconductor device 20 can include a pair of stacked PFETs having independently controlled gates. According to yet another non-limiting embodiment of the present invention, the hybrid stacked semiconductor device 30 can include a pair of stacked NFETs having a shared gate. According to still another non-limiting embodiment of the present invention, the hybrid stacked semiconductor device 40 can include a pair of stacked PFETs having a shared gate. According to yet another non-limiting embodiment of the present invention, the hybrid stacked semiconductor device 50 can include a stacked CMOS FET (e.g., an NFET stacked over a PFET, and vice versa) having independently controlled gates. According to still another non-limiting embodiment of the present invention, the hybrid stacked semiconductor device 60 can include a stacked CMOS FET (e.g., an NFET stacked over a PFET, and vice versa) having a shared gate. Accordingly, various non-limiting embodiments of the hybrid stacked semiconductor device described herein can be employed in wide range of applications such as AI applications, for example, while satisfying the continued trend of reducing the footprint of semiconductor device.

In accordance with non-limiting embodiments of the present invention, operations described herein for fabricating a hybrid stacked semiconductor device include forming a dielectric isolation between stacked channels to form either independent gate regions or a shared gate region. Accordingly, gate extensions can be formed respectively in the independent gate regions to facilitate the formation of independently controlled gates, or can be formed in the shared gate region to facilitate the formation of a shared gate.

Figure 2:
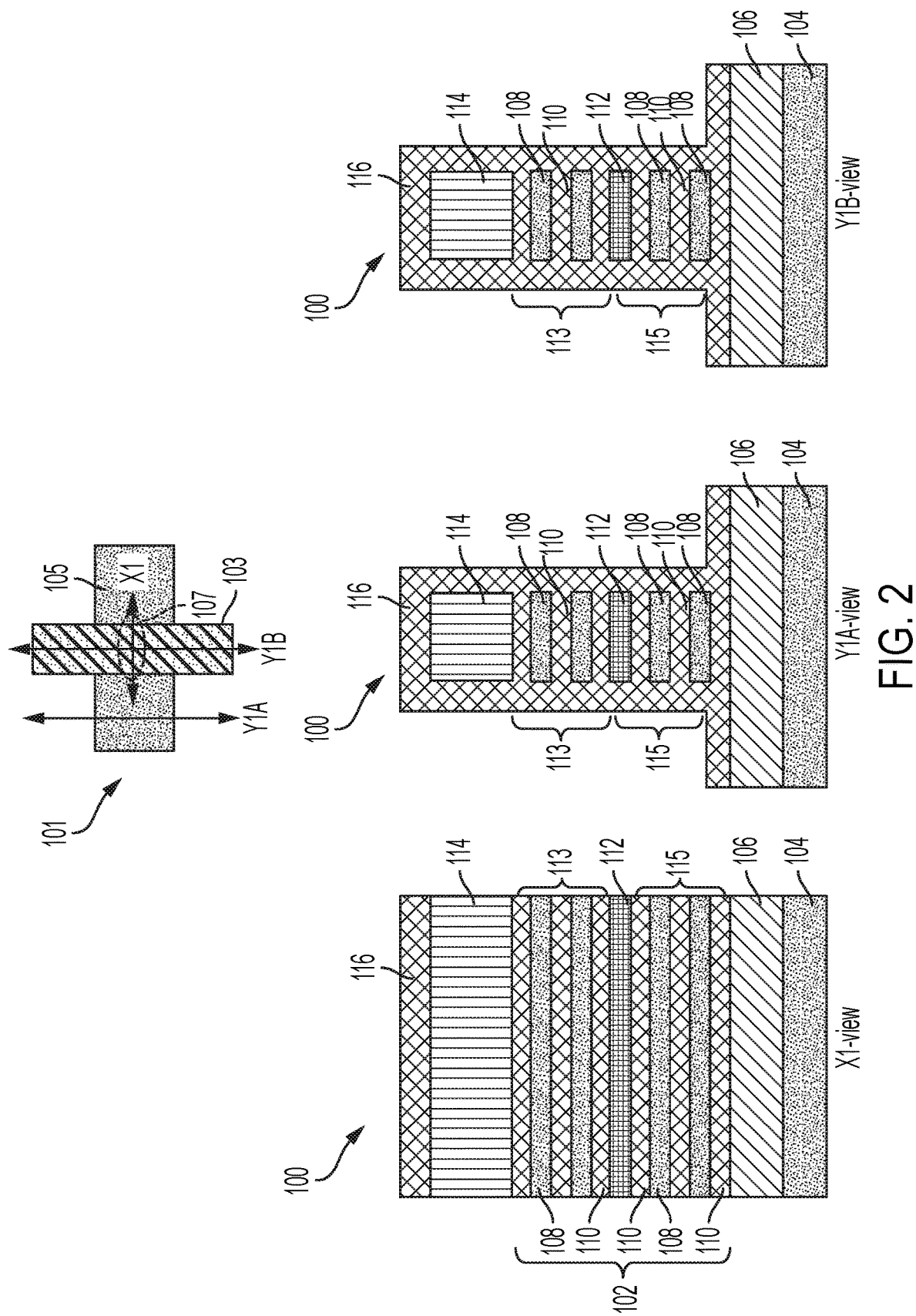

Turning now to a more detailed description of fabrication operations and resulting structures according to aspects of the present invention, FIGS. 2-19 depict a hybrid stacked semiconductor device 100 after performing various fabrication operations. Although the cross-sectional diagrams depicted in FIGS. 2-19 are two-dimensional, it is understood that the diagrams depicted in FIGS. 2-19 represent three-structures. The top-down reference diagram 101 shown in FIG. 2 provides a reference point for the various cross-sectional views (X-view, Y1A-view, and Y1B-view) shown in FIGS. 2-19. The X-view taken along line-X is a side view taken across the gate region 103 (i.e., the region where a gate will be formed), the Y1A-view taken along line-Y1A is a side view taken across active region 105 between the gates (also referred to as an "S/D region" where one or more source/drains will be formed), and the Y1B-view taken along line-Y1B is a side view taken across the active region 107 under the gate also referred to as a "channel region" located beneath the gate where one or more types of NS stacks will be formed).

With reference to FIG. 2, a hybrid stacked semiconductor device 100 is illustrated after performing various known intermediate fabrication operations in accordance with aspects of the present invention. At this stage, the hybrid stacked semiconductor device 100 includes a NS stack 102 formed on a substrate 104. The substrate 104 can be made of any suitable substrate material, such as, for example, monocrystalline Si, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys.

In some embodiments of the invention, the substrate 104 can include a buried oxide layer 106 to provide a silicon-on-insulator (SOI) configuration. The buried oxide layer 106 can be made of any suitable dielectric material, such as, for example, a silicon oxide. In some embodiments of the invention, the buried oxide layer 106 is formed to a thickness of about 145 nm, although other thicknesses are within the contemplated scope of the invention.

In some embodiments of the invention, the NS stack 102 can include one or more semiconductor layers 108 alternating with one or more sacrificial layers 110. In some embodiments of the invention, the semiconductor layers 108 and the sacrificial layers 110 are epitaxially grown layers. In some embodiments of the invention, a top stack portion 113 of the NS stack 102 (also referred to herein as a top NS stack 113) is separated from a bottom stack portion 115 of the NS stack 102 (also referred to herein as a bottom NS stack 115) by a sacrificial spacer layer 112. The top and bottom portions 113 and 115 of the NS stack 102 can define a respective channel type. For example, in some embodiments of the invention, the semiconductor layers 108 in the top portion 113 of the NS stack 102 define a first stack of channels (e.g., n-type channels) in the final device, while the semiconductor layers 108 in the bottom portion 115 of the NS stack 102 define a second stack of the same type of channels (e.g., n-type channels) in the final device. In other embodiments of the invention, the semiconductor layers 108 in the top portion 113 of the NS stack 102 define a first type of stacked channels (e.g., a stack of p-type channels) in the final device, while the semiconductor layers 108 in the bottom portion 115 of the NS stack 102 define a second type of stacked channels (e.g., p-type channels) in the final device.

For ease of discussion reference is made to operations performed on and to an NS stack 102 having four nanosheets (e.g., the four semiconductor layers 108 shown in FIG. 2) alternating with six sacrificial layers 110. It is understood, however, that the NS stack 102 can include any number of nanosheets alternating with a corresponding number of sacrificial layers. For example, the NS stack 102 can include two nanosheets, five nanosheets, eight nanosheets, or any number of nanosheets, along with a corresponding number of sacrificial layers (i.e., as appropriate to form a nanosheet stack having a bottommost sacrificial layer under a bottommost nanosheet and a sacrificial layer between each pair of adjacent nanosheets). Moreover, while the NS stack 102 is depicted as having the same number of channels (semiconductor layers 108) above and below the sacrificial spacer layer 112, configuration shown is not required. In some embodiments of the invention, the top portion 113 of the NS stack 102 can have more or less channels (e.g., semiconductor layers 108) than the bottom portion 115 of the NS stack 102.

The semiconductor layers 108 can be made of any suitable material such as, for example, monocrystalline silicon or silicon germanium. In some embodiments of the invention, the semiconductor layers 108 are silicon nanosheets. In some embodiments of the invention, the semiconductor layers 108 have a thickness of about 4 nm to about 10 nm, for example 6 nm, although other thicknesses are within the contemplated scope of the invention. In some embodiments of the invention, the substrate 104 and the semiconductor layers 108 can be made of a same semiconductor material. In other embodiments of the invention, the substrate 104 can be made of a first semiconductor material, and the semiconductor layers 108 can be made of a second semiconductor material.

The sacrificial layers 110 can be silicon or silicon germanium layers, depending on the material of the semiconductor layers 108 to meet etch selectivity requirements. For example, in embodiments of the invention where the semiconductor layers 108 are silicon nanosheets, the sacrificial layers 110 can be silicon germanium layers. In embodiments of the invention where the semiconductor layers 108 are silicon germanium nanosheets, the sacrificial layers 110 can be silicon germanium layers having a germanium concentration that is greater than the germanium concentration in the semiconductor layers 108. For example, if the semiconductor layers 108 are silicon germanium having a germanium concentration of 5 percent (sometimes referred to as SiGe5), the sacrificial layers 110 can be silicon germanium layers having a germanium concentration of about 25 (SiGe25), although other germanium concentrations are within the contemplated scope of the invention. In some embodiments of the invention, the sacrificial layers 110 have a thickness of about 8 nm to about 15 nm, for example 10 nm, although other thicknesses are within the contemplated scope of the invention.

The sacrificial spacer layer 112 can be made of silicon germanium layers having a germanium concentration selected to provide etch selectivity with respect to both the semiconductor layers 108 and the sacrificial layers 110. For example, in embodiments of the invention where the semiconductor layers 108 are SiGe5 nanosheets and the sacrificial layers 110 are SiGe25 layers, the sacrificial spacer layer 112 can be SiGe60, although other germanium concentrations are within the contemplated scope of the invention. As shown with respect to FIG. 9, the sacrificial spacer layer 112 is replaced by a dielectric spacer 202 that separates the top portion 113 of the NS stack 102 from the bottom portion 115 of the NS stack 102. Consequently, the thickness of the sacrificial spacer layer 112 defines the final dielectric separation between the top and bottom portions 113 and 115 of the NS stack 102. In some embodiments of the invention, the sacrificial spacer layer 112 can have a thickness of about 5 nm to about 35 nm, for example 15 nm, although other thicknesses are within the contemplated scope of the invention.

With continued reference to FIG. 2, a hard mask 114 is formed over the NS stack 102. The portion of the NS stack 102 over which the hard mask 114 is formed is referred to as an active region (105 and 107). In some embodiments of the invention, the hard mask 114 can be made of any suitable material, such as, for example, a silicon nitride. The hard mask is utilized to define the dimensions of the active region 105 and 107. For example, the hard mask 114 can be patterned to achieve a targeted length and width. A wet or dry etch process can then be subsequently performed to selectively remove portions NS stack which are not covered by the pattered hard mask. Accordingly, the portion of the NS stack 102 still remaining beneath the hard mask defines the active region 105 and 107. In some embodiments of the invention, the hard mask 114 is further utilized to protect the active region 105 and 107 from various subsequent fabrication processes performed to obtain the completed hybrid stacked semiconductor device 100 shown, for example, in FIGS. 14 and 19.

Still referring to FIG. 2, the hybrid stacked semiconductor device 100 is shown following deposition of a gate extension layer 116. The gate extension layer 116 is conformally deposited such that it lines the surface of the substrate 104

(e.g., the upper surface of the oxide layer 106), along with the sidewalls of the NS stack 102. Accordingly, the gate extension layer 116 is formed in both the S/D region 105 (as shown in view Y1A) and the channel region 107 (as shown in view Y1B).

The gate extension layer 116 can be deposited using a chemical vapor deposition (CVD) process, for example, and can have a thickness ranging, for example, from about 8 nm to about 20 nm. In one or more embodiments of the invention, the gate extension layer 116 is the same material as the sacrificial layers 110. For example, if the sacrificial layers 110 are SiGe25 layers, the gate extension layer 116 is also a layer of SiGe25.

Figure 3:
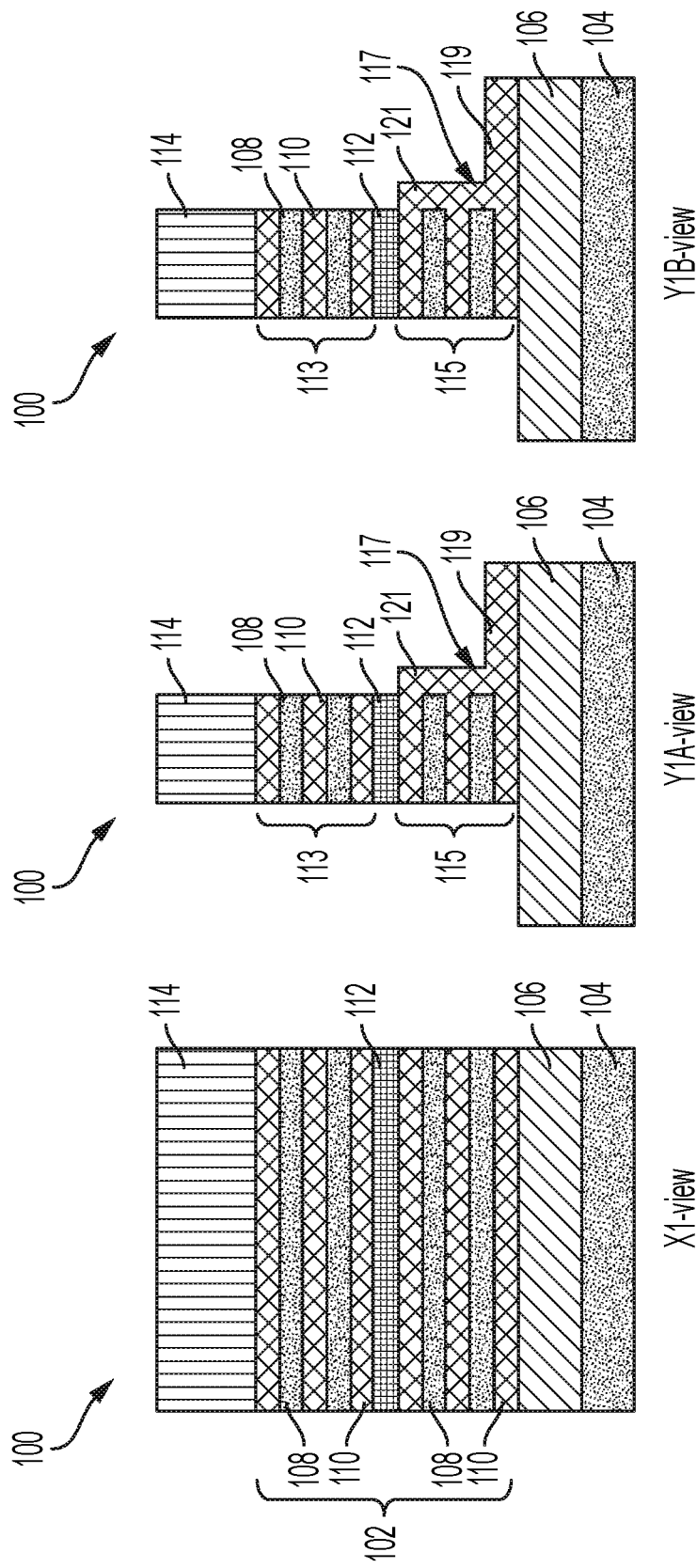

Turning now to FIG. 3, the hybrid stacked semiconductor device 100 is illustrated after recessing and patterning the gate extension layer 116. According to an embodiment of the invention, the gate extension layer 116 located in the active region 105 and 107 can first be recessed to the interface between the sacrificial spacer layer 112 and the bottom NS stack 115 or just above the interface between the sacrificial spacer layer 112 and the bottom NS stack 115. A directional RIE process that attacks the material of the gate extension layer 116 without substantially reacting to the remaining materials of the hybrid stacked semiconductor device 100 can be performed to recess the gate extension layer 116. The bottom horizontal portion of the gate extension layer over dielectric layer 106 can be protected by a softmask such as a recessed OPL.

The recessed the gate extension layer 116 located in the active region 105 and 107 can then be patterned by depositing a soft mask layer formed from an OPL material (not shown) that covers the recessed gate extension layer 116, and removing a portion of the soft mask layer formed against one side of the bottom NS stack 115, while maintaining a portion of the soft mask layer formed on the opposite side of the NS stack 115. Accordingly, a first portion of the recessed gate extension layer 116 will be exposed (e.g., the left-side portion of the recessed gate extension layer 116), while a second portion of the recessed gate extension layer 117 will remain covered by the remaining soft mask (e.g., the right-side portion of the recess gate extension layer 117).

Thereafter, another directional RIE process that attacks the material of the gate extension layer 116 without substantially reacting to the remaining materials of the hybrid stacked semiconductor device 100 can be performed to remove the exposed portion of the gate extension layer 116. The softmask layer can then be removed to expose the remaining portion of the gate extension layer 117 that is formed on one side of the bottom NS stack 115 as shown in FIG. 3.

Going forward, the remaining portion of the gate extension layer 117 will be simply referred to as a first gate extension 117 (i.e., a bottom gate extension 117). As shown in FIG. 3, the bottom gate extension 117 is present in the active region 105 (as shown in view-Y1A) and 107 (as shown in view Y1B). The bottom gate extension 117 includes a base portion 119 and a side portion 121. The base portion 119 is formed on the substrate 104 (e.g., the upper surface of the oxide layer 106) and extends from a sidewall of the bottom NS stack 115 in a first direction. The side portion 121 extends upwards from the base portion 119 and lines the side of the bottom NS stack 115. Although the aforementioned example forms the bottom gate extension 117 on the right side of the bottom NS stack 115, it should be appreciated that the bottom gate extension 117 can be formed on left side of the bottom NS stack 115 without departing from the scope of the invention.

Figure 4:
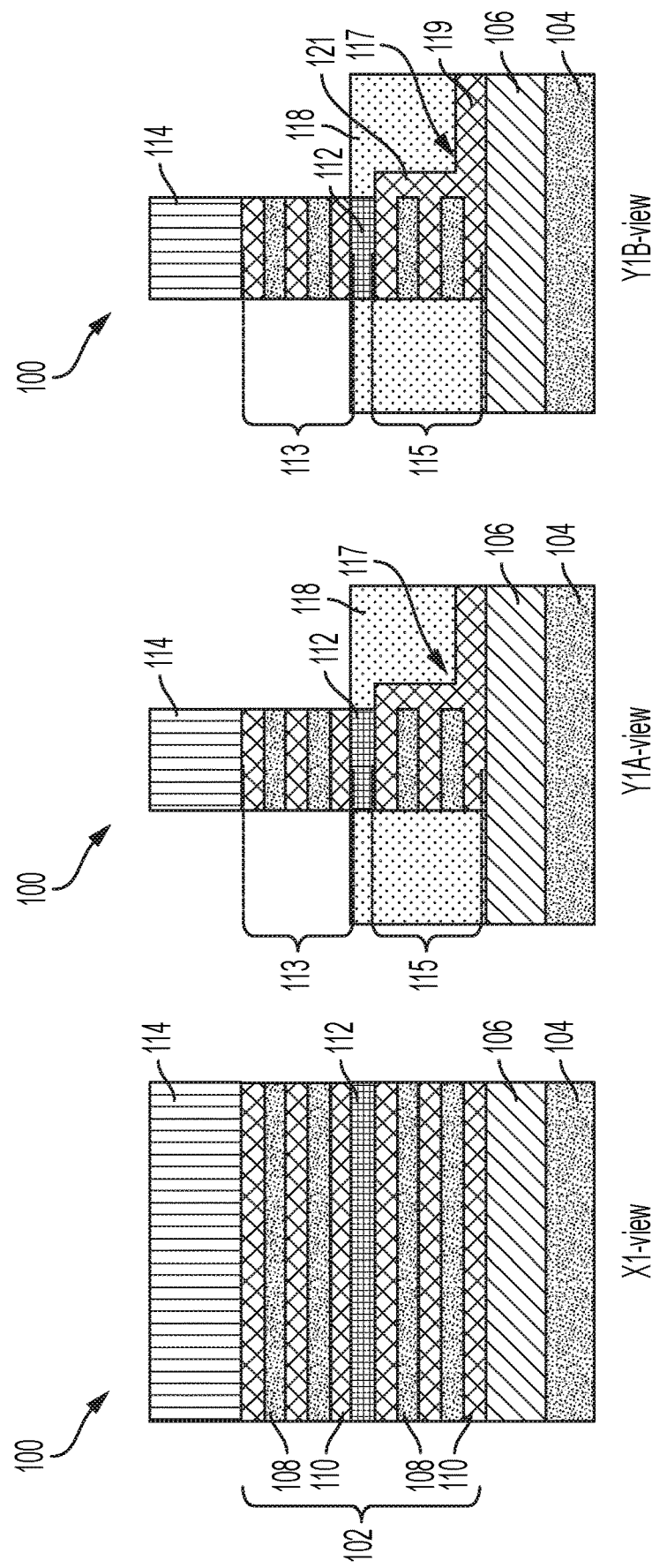

Referring to FIG. 4, the hybrid stacked semiconductor device 100 is illustrated after depositing a first interlayer dielectric (ILD) 118 over the wafer. The first ILD 118 can be formed from various dielectric materials including, but not limited to, silicon dioxide ($SiO_2$), SiN, SiOC, SiOCN, SiC, or combination of several layers. The first ILD 118 is then recessed to the interface between the sacrificial spacer layer 112 and the bottom NS stack 115 or just above the interface between the sacrificial spacer layer 112 and the bottom NS stack 115. A RIE or wet etch process that attacks the material of the first ILD 118 without substantially reacting to the remaining materials of the hybrid stacked semiconductor device 100 can be performed to recess the first ILD 118. Accordingly, portions of the bottom gate extension 117 located in the active region 105 and 107 remains covered by the recessed ILD 118.

Figure 5:
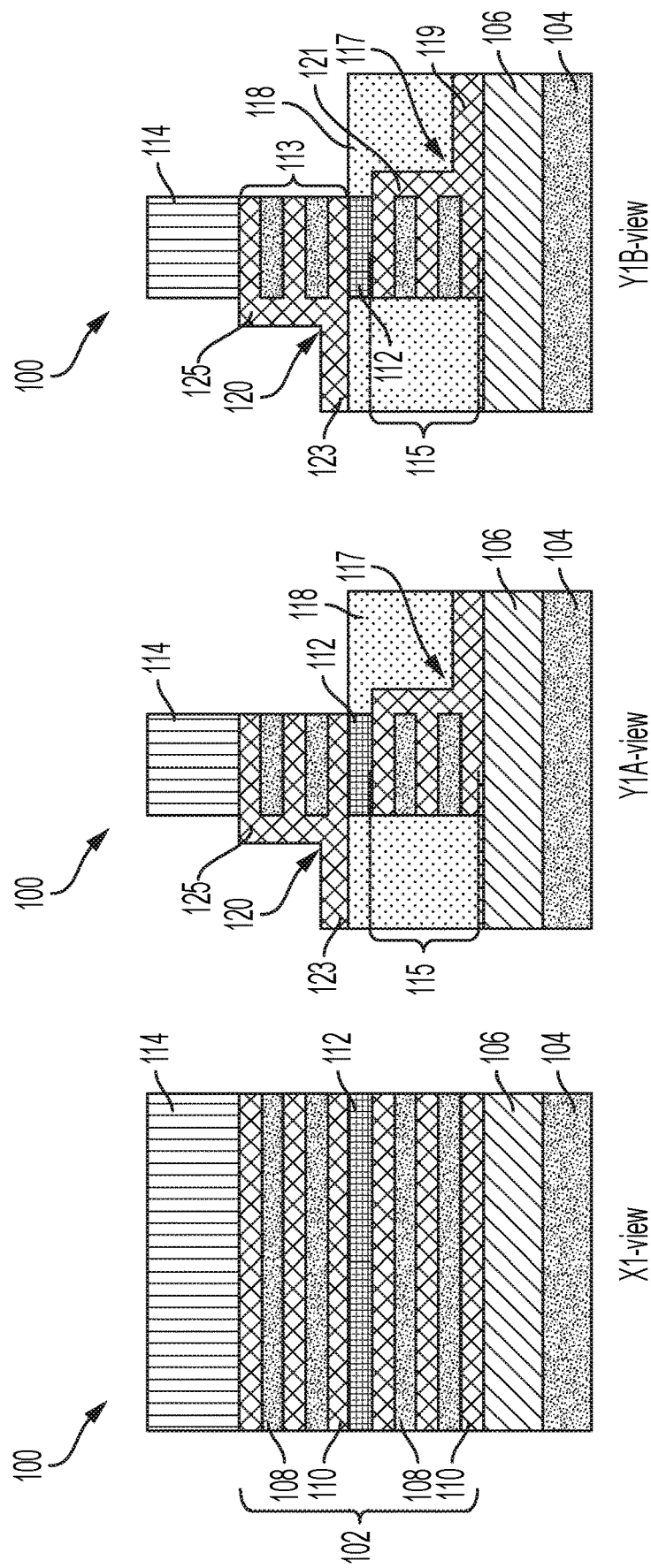

Turning to FIG. 5, the hybrid stacked semiconductor device 100 is illustrated after forming a second gate extension 120 (e.g., a top gate extension 120) in active region 105 and 107. The top gate extension 120 is formed using techniques similar to those used to form the bottom gate extension 117. Therefore, details pertaining to the formation of the top gate extension 120 will not be repeated for the sake of brevity. As shown in FIG. 5, the top gate extension 120 is formed against the top NS stack 113, but on an opposite side with respect to the bottom gate extension 117. Accordingly, the top gate extension 120 includes a base portion 123 that is formed on an upper surface of the ILD 118 and extends from a sidewall of the top NS stack 113 in a second direction that is opposite the first direction of the bottom base portion 119. The side portion 125 extends upwards from the base portion 123 and lines the side of the top NS stack 113.

Figure 6:
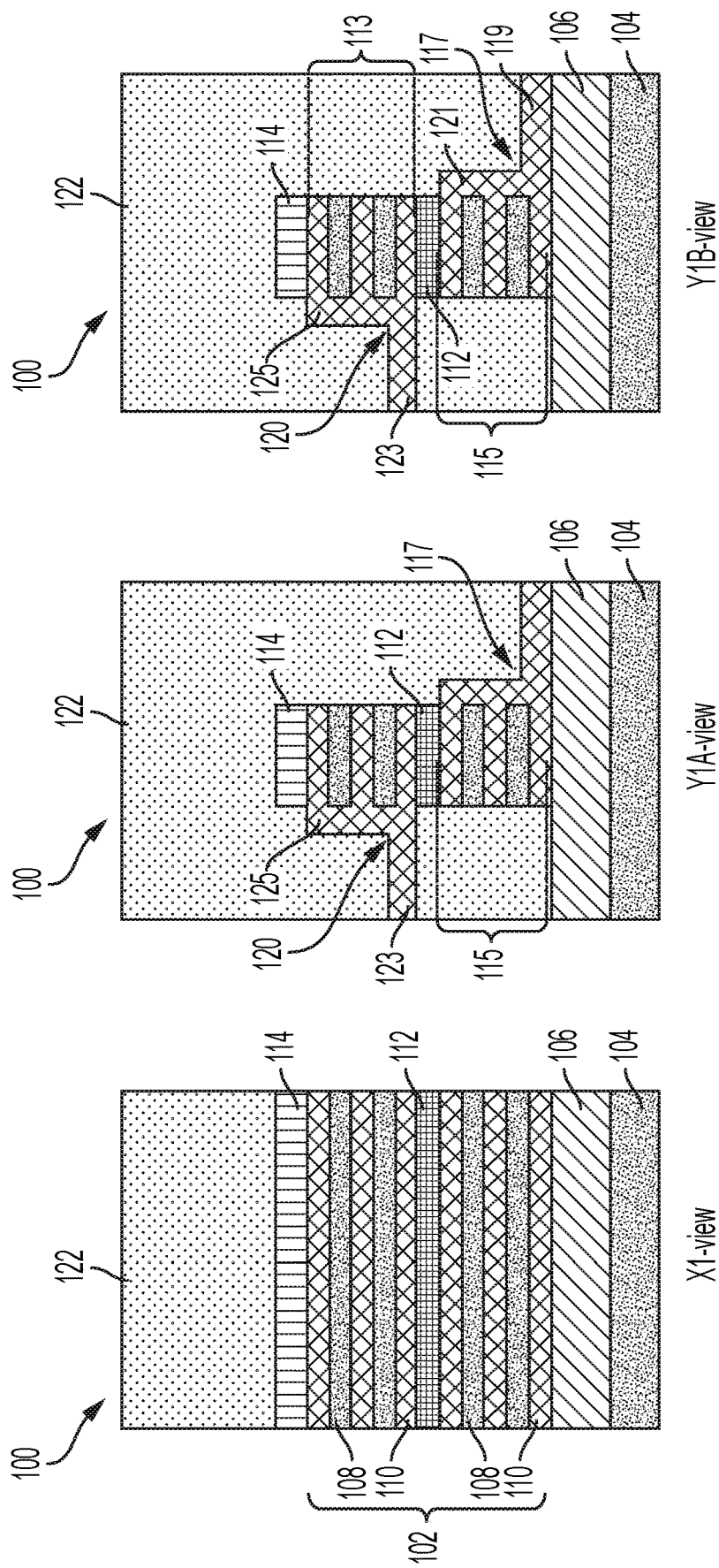

Referring to FIG. 6, the hybrid stacked semiconductor device 100 is illustrated after depositing a second ILD 122 on the first ILD 118. Similar to the first ILD 118, the second ILD 122 can be formed from a dielectric material including but not limited to, silicon dioxide ($SiO_2$), SiN, SiOC, SiOCN, SiC, or combination of several layers. In some embodiments of the present invention, an etch process can be performed to reduce the height of the hardmask layer 114 prior to depositing the ILD 122. As shown in FIG. 6, the bottom and top gate extensions 117 and 120 located in the active region 105 (as shown in view-Y1A) and 107 (as shown in view Y1B) are covered and encapsulated by the first and second ILDs 118 and 122.

Figure 7:
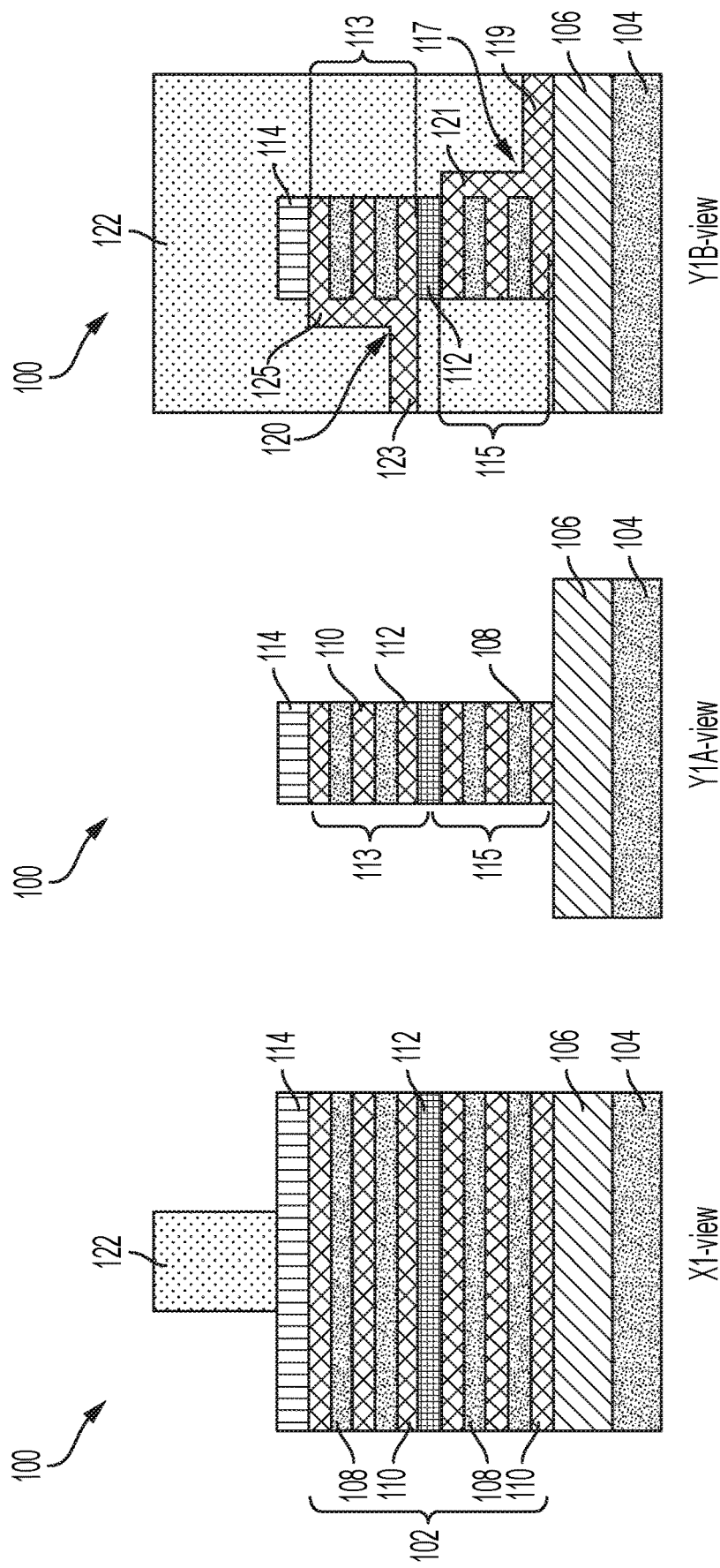

Turning to FIG. 7, the hybrid stacked semiconductor device 100 is illustrated after removing a portion of the first and second ILDs 118 and 122 from the region that is not coved by gate mask (as shown in view-Y1A), while maintaining a portion of the first and second ILDs 118 and 122 in the channel region 107 (as shown in view Y1B) that is protected by the gate mask (not shown). Accordingly, portions of the bottom and top gate extensions 117 and 120 located in the S/D region 105 (as shown in view-Y1A) are exposed, while portions of the bottom and top gate extensions 117 and 120 located in the in the channel region 107 (as shown in view-Y1B) remain covered.

After removing the portions of the first and second ILDs 118 and 122 from the S/D region 105 (as shown in view-Y1A), a directional RIE process that attacks the material of the bottom and top gate extensions 117 and 120 without substantially reacting to the remaining materials of the hybrid stacked semiconductor device 100 (including the first and second ILDs 118 and 122) can be performed to remove the portions of the bottom and top gate extensions 117 and 120 from the S/D region 105 (as shown in view-Y1A).

The ILD 122 that is maintained in the channel region 107 (as shown in view-Y1B) protects the bottom and top gate extensions 117 and 120 when etching the bottom and top gate extensions 117 and 120 from the S/D region 105 (as shown in view-Y1A). Accordingly, the bottom and top gate extensions 117 and 120 maintained in the channel region 107 (as shown in view-Y1B) facilitates the formation of independently controlled gates corresponding to the bottom NS stack 115 and the top NS stack 113, respectively.

For example, the base portion 119 of the bottom gate extension 117 extends laterally from the sidewall of the bottom NS stack 115 in a first direction, while the base portion 123 of the top gate extension 120 extends laterally from the sidewall of the top NS stack 113 in a second direction opposite the first direction of the bottom base portion 119. The bottom base portion 119 provides a first contact area for a first gate contact that can be used to control the bottom NS stack 115, while the top base portion 123 provides a second contact area for a second gate contact that can be used to control the top NS stack 113. The opposing orientations of the bottom and top base portions 119 and 123 allow for forming the first gate contact that is separated (i.e., electrically isolated) from the second gate contact. In this manner, a hybrid stacked semiconductor device 100 including stacked FETs having independently controlled gates can be fabricated according to embodiments of the invention described herein.

Figure 8:
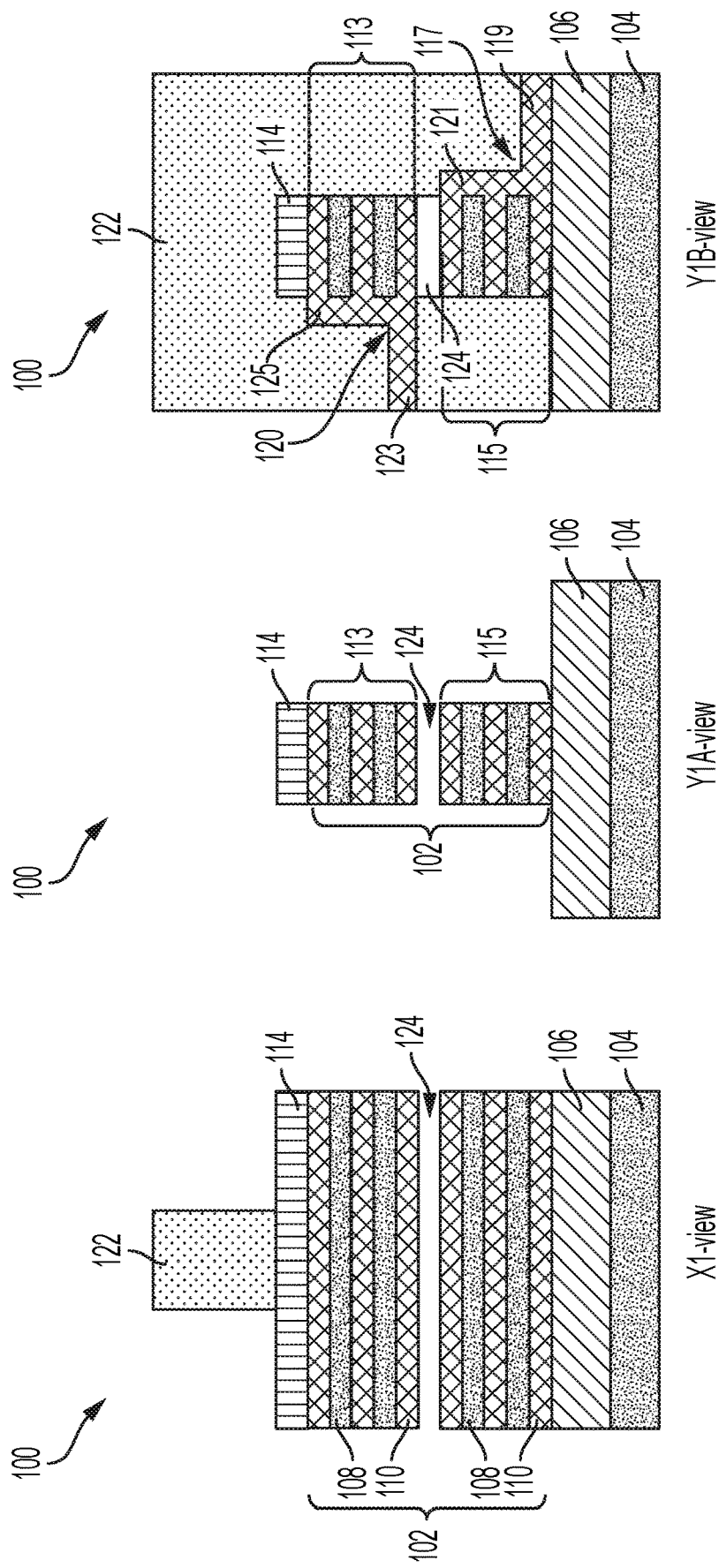

Turning now to FIG. 8, the hybrid stacked semiconductor device 100 is illustrated after removing the sacrificial spacer layer 112. In one or more embodiments of the present invention, an etching process that utilizes an etchant chemistry that attacks the material of the sacrificial spacer layer 112 without substantially reacting to the remaining materials of the hybrid stacked semiconductor device 100 can be applied to the sacrificial spacer layer 112 that is exposed to an opening formed when removing the first and second ILDs 118 and 122. For example, SiGe60 can be removed selective to silicon and SiGe25 using a vapor phase HCl etch. Accordingly, a spacer void 124 is formed between the top NS stack 113 and the bottom NS stack 115.

Figure 9:
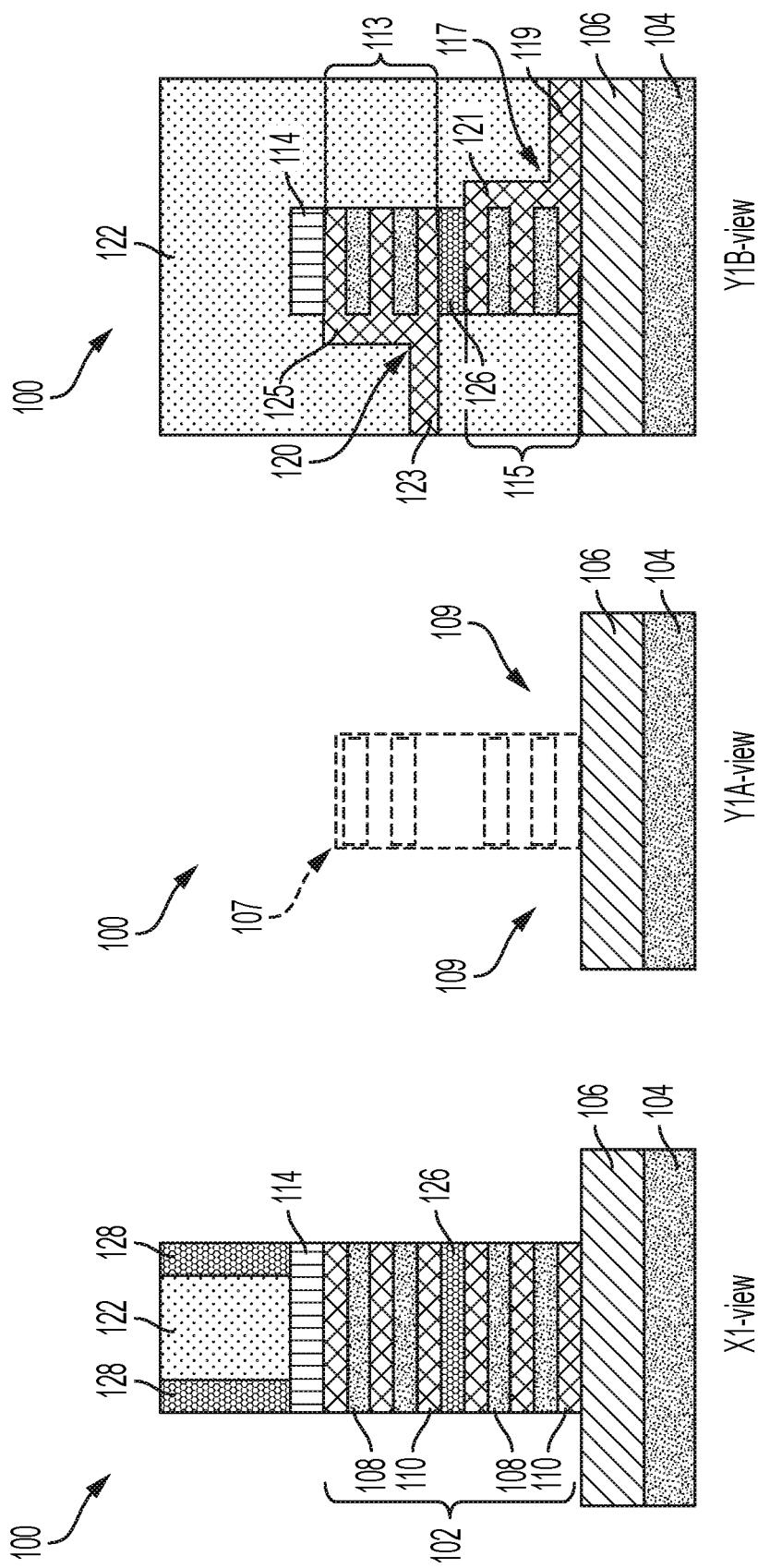

With reference now to FIG. 9, the hybrid stacked semiconductor device 100 is illustrated after filling the spacer void 124 with a dielectric material 126. In one or more embodiments of the invention, the dielectric material 126 forms a dielectric spacer 126 that separates (e.g., electrically isolates) the remaining portions of the top NS stack 113 from the remaining portions of the bottom NS stack 115.

With continued reference to FIG. 9, sidewall spacers 128 (sometimes referred to as gate spacers) are formed on sidewalls of the gate (which is the pillar defined by remaining ILD 122 and ILD 118). In some embodiments of the invention, the sidewall spacers 128 and dielectric material 126 are formed using a chemical vapor deposition (CVD), plasma-enhanced CVD (PECVD), ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), atomic layer deposition (ALD), physical vapor deposition (PVD), chemical solution deposition, molecular beam epitaxy (MBE), or other like process in combination with a wet or dry etch process. For example, spacer material can be conformally deposited and selectively removed using a RIE to form the sidewall spacers 128.

In some embodiments of the invention, the dielectric spacer 126 is formed concurrently with the sidewall spacers 128 as the spacer material is deposited. In other words, the spacer material 128 deposited onto sidewalls of the gate can also fill the spacer void 124.

The sidewall spacers 128 can be made of any suitable material, such as, for example, a low-k dielectric, a nitride, silicon nitride, silicon oxide, SiON, SiC, SiOCN, or SiBCN. In some embodiments of the invention, the sidewall spacers 128 include silicon nitride. The sidewall spacers 128 can be formed to a thickness of about 5 to 40 nm, although other thicknesses are within the contemplated scope of the invention.

With continued reference to FIG. 9, a portion of the NS stack 102 located in the S/D region 105 (as shown in view-Y1A) is removed (sometimes referred to as a stack recess) form an active area void 109 that exposes a surface of the buried oxide layer 106 (or the substrate 104 when the buried oxide layer 106 is not present) along with exposing the channel region 107. The NS stack 102 can be recessed using, for example, a wet etch, a dry etch, or a combination of wet and/or dry etches. In some embodiments of the invention, the NS stack 102 is recessed using a RIE process. In some embodiments of the invention, the NS stack 102 is recessed selective to the sidewall spacers 128 and ILD 122.

Figure 10:
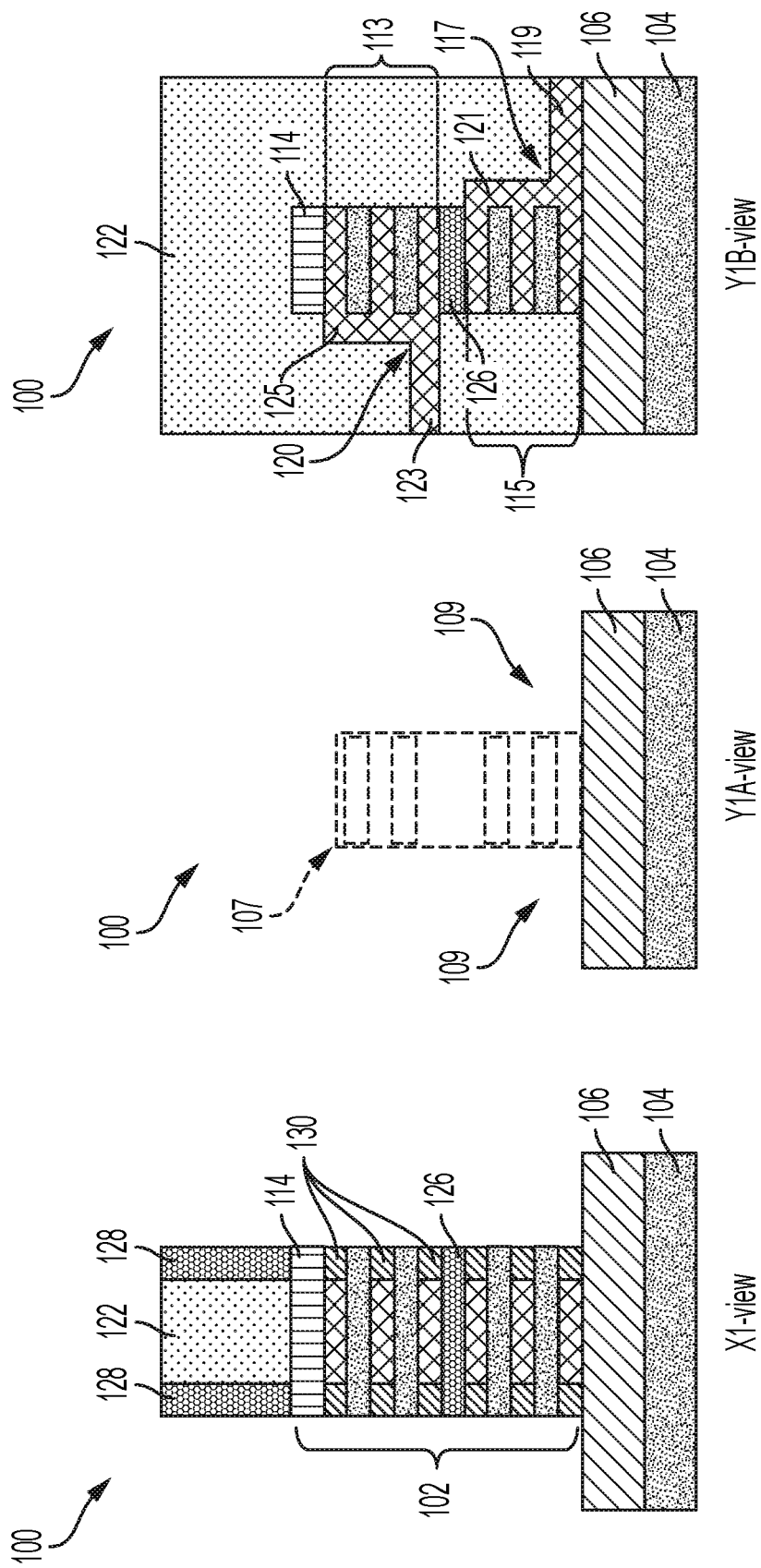

Referring now to FIG. 10, the hybrid stacked semiconductor device 100 is illustrated after recessing a portion of the sacrificial layers 110 to form cavities (not shown) in the NS stack 102. The cavities are then filled with a dielectric material to form inner spacers 130. In some embodiments of the invention, portions of the inner spacers 130 that extend beyond sidewalls of the NS stack 102 are removed, using, for example, by an isotropic etching process. In this manner, sidewalls of the inner spacers 130 are coplanar (i.e., "flush") with sidewalls of the semiconductor layers 108.

In some embodiments of the invention, the inner spacers 130 are formed using a CVD, PECVD, ALD, PVD, chemical solution deposition, or other like processes in combination with a wet or dry etch process. The inner spacers 130 can be made of any suitable material, such as, for example, a low-k dielectric, a nitride, silicon nitride, silicon dioxide, SiON, SiC, SiOCN, or SiBCN.

Figure 11:
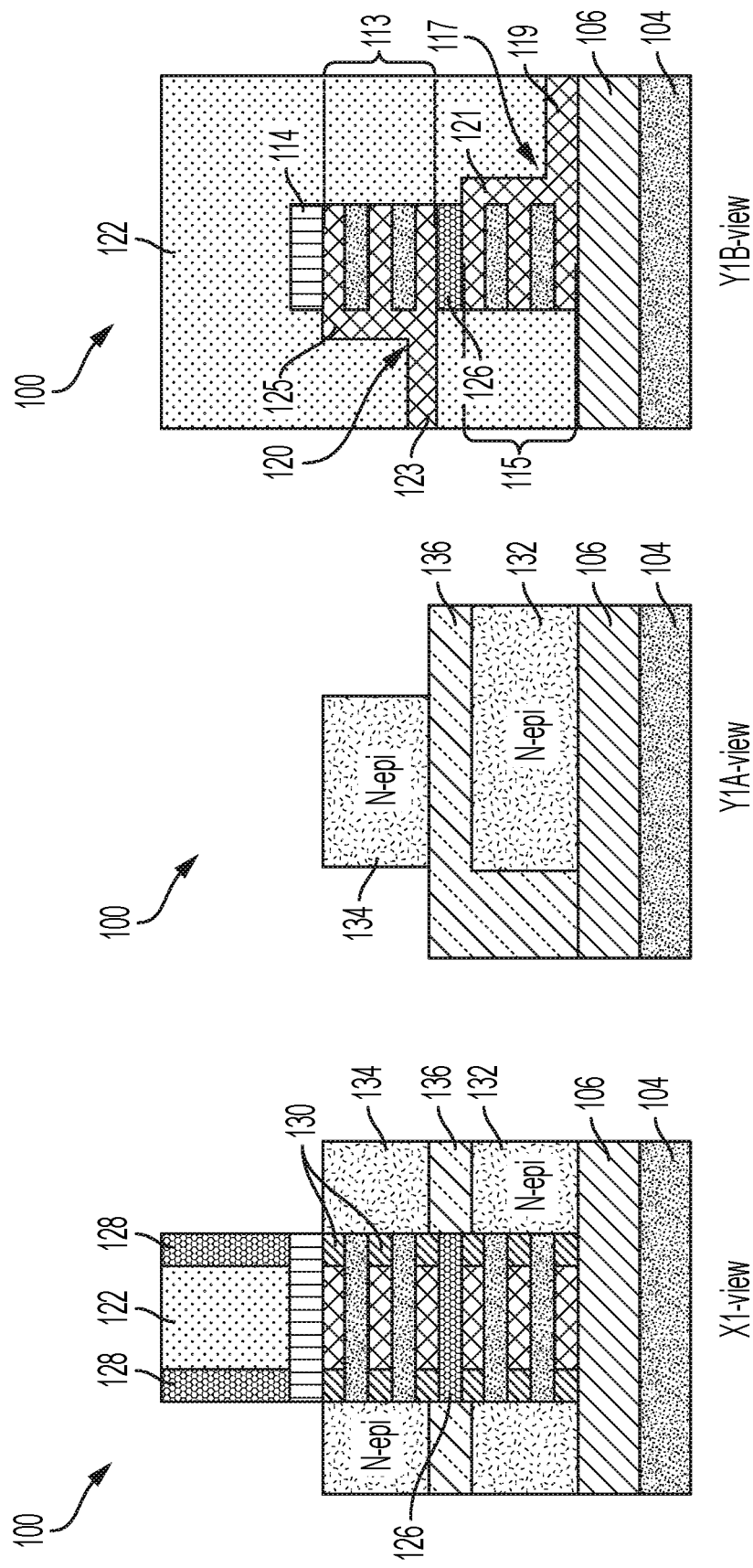

Turning to FIG. 11, the hybrid stacked semiconductor device 100 is illustrated after forming a first source/drain 132 (e.g., a bottom S/D 132) that contacts the bottom NS stack 115 and a second S/D 134 (e.g., a top S/D 134) that contacts the top NS stack 113. In some embodiments of the invention, the bottom S/D 132 is the same semiconductor type material as the top S/D 134. For example, the bottom S/D 132 and the top S/D 134 are formed of a n-type semiconductor material. In this manner, a hybrid stacked semiconductor device 100 that includes a pair of stacked NFETs can be fabricated as described herein.

In some embodiments of the invention, the bottom S/D 132 and the top S/D 134 can both be formed of a p-type semiconductor material. In this manner, a hybrid stacked semiconductor device 100 that includes a pair of stacked PFETs can be fabricated as described herein.

In some embodiments of the invention, the bottom S/D 132 can be formed of a first type of semiconductor material, while the top S/D 134 can be formed from a second type of semiconductor material different from the first semiconductor material of the bottom S/D 132. For example, the bottom S/D 132 can be formed of an n-type semiconductor material, while the top S/D 134 can be formed of a p-type of semiconductor material, or vice versa. In this manner, a hybrid stacked semiconductor device 100 that includes a stacked CMOS FET can be fabricated as described herein.

With continued reference to FIG. 11, the bottom S/D 132 and the top S/D 134 can be epitaxially grown from exposed sidewalls of the bottom NS stack 115 and the top NS stack 113, respectively, using, for example, vapor-phase epitaxy (VPE), molecular beam epitaxy (MBE), liquid-phase epitaxy (LPE), or other suitable processes. In some embodiments of the invention, the gas source for the epitaxial deposition of semiconductor material includes a silicon containing gas source, a germanium containing gas source, or a combination thereof. For example, a Si layer can be epitaxially deposited (or grown) from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. A germanium layer can be epitaxially deposited from a germanium gas source that is selected from the group consisting of germane, digermane, halogermane, dichlorogermane, trichlorogermane, tetrachlorogermane and combinations thereof. A silicon germanium alloy layer can be epitaxially formed utilizing a combination of such gas sources. Carrier gases like hydrogen, nitrogen, helium and argon can be used. In some embodiments of the invention, the epitaxial semiconductor materials include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

In some embodiments of the invention, epitaxially grown silicon and silicon germanium can be doped by adding n-type dopants (e.g., P or As) or p-type dopants (e.g., Ga, B, BF2, or Al). In some embodiments of the invention, the first S/D 132 and the second S/D 134 can be epitaxially formed and doped by a variety of methods, such as, for example, in-situ doped epitaxy (doped during deposition), doped following the epitaxy, or by implantation and plasma doping. The dopant concentration in the doped regions can range from 1×1019 cm-3 to 2×1021 cm-3, or between 1×1020 cm-3 and 1×1021 cm-3.

In some embodiments of the invention, the bottom S/D 132 and the top S/D 134 are made of silicon or silicon germanium. In some embodiments of the invention, the bottom S/D 132 and the top S/D 134 are made of silicon germanium doped with boron to a boron concentration of about 1 to about 15 percent, for example, 2 percent, although other boron concentrations are within the contemplated scope of the invention.

With continued reference to FIG. 11, an isolation dielectric 136 is formed between the bottom S/D 132 and the top S/D 134. The isolation dielectric 136 can be made of any suitable dielectric material, such as, for example, oxides, a low-k dielectric, nitrides, silicon nitride, silicon oxide, SiON, SiC, SiOCN, and SiBCN. In some embodiments of the invention, the isolation dielectric 136 is deposited on the substrate 104 (e.g., the upper surface of the oxide layer 106) to cover the bottom S/D 132 prior to forming the top S/D 134. In some embodiments of the invention, the isolation dielectric 136 can then be etched and recessed to a height at or above the topmost surface of the dielectric spacer 126. The top S/D 134 can then be formed on an upper surface of the isolation dielectric 136 as described herein. In this manner, the isolation dielectric 136 provides dielectric isolation between the bottom S/D 132 and the top S/D 134.

Figure 12:
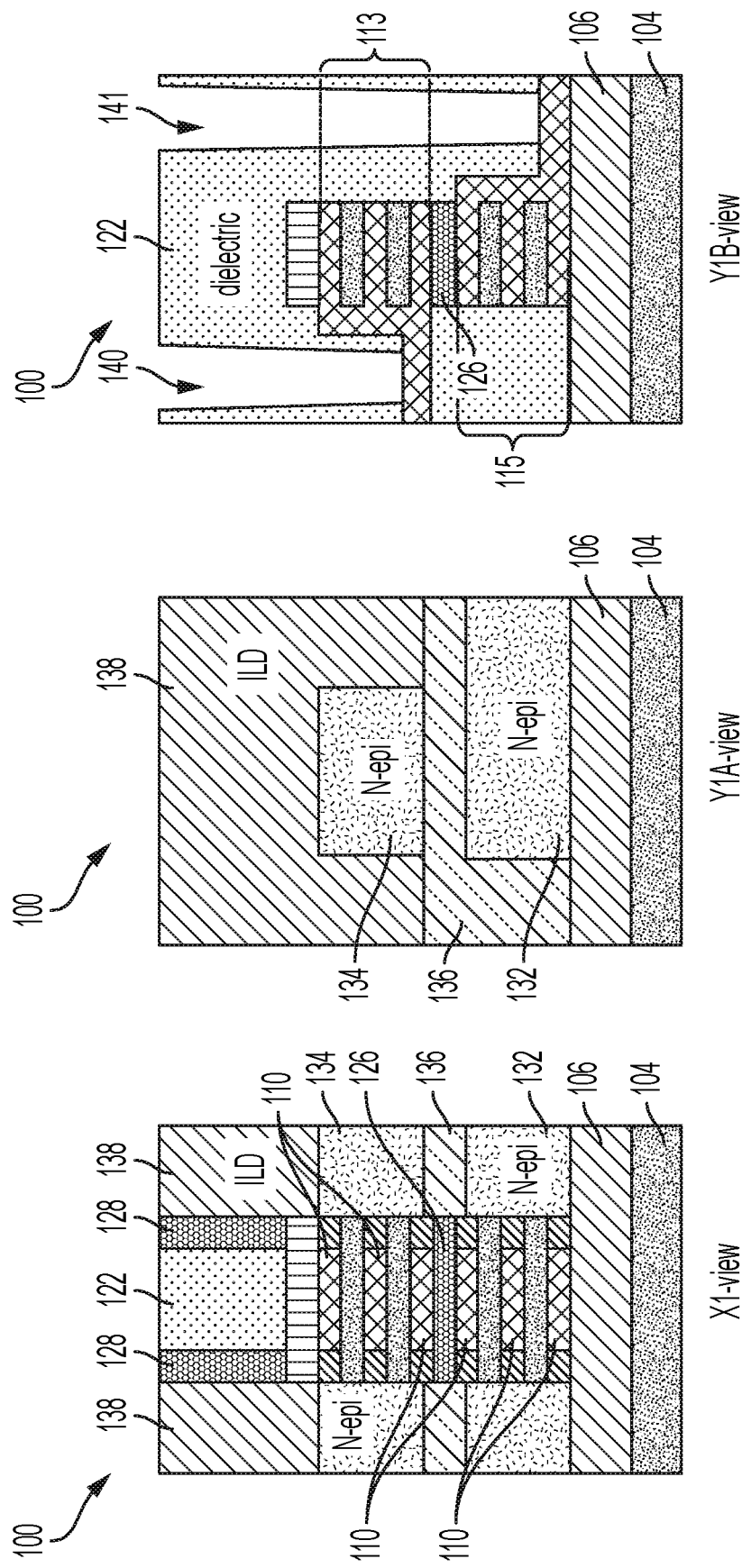

Turning now to FIG. 12, the hybrid stacked semiconductor device 100 is illustrated following deposition of a third ILD 138. The third ILD 138 can be made of any suitable dielectric material, such as, for example, porous silicates, carbon doped oxides, silicon dioxides, silicon nitrides, silicon oxynitrides, or other dielectric materials. Any known manner of forming the interlayer dielectric 138 can be utilized, such as, for example, CVD, PECVD, ALD, flowable CVD, spin-on dielectrics, or PVD. In some embodiments of the invention, the hybrid semiconductor device 100 is planarized and stops on the upper surface of the sidewall spacers 128 and the second ILD 122. The third ILD 138 can be planarized using, for example, a chemical-mechanical planarization (CMP) process.

With continued reference to FIG. 12, a first gate contact trench 140 and a second gate contact trench 141 are formed over the gate extension layer (as shown in view Y1B). In some embodiments of the invention, the gate contact trenches 140 and 141 can be patterned using lithography followed by etching to expose the base portion 119 of the bottom gate extension 117 and the base portion 123 of the top gate extension 120. Any known method can be used for etching the pattern of the gate contact trenches 140 and 141 into the second ILD 122, such as, for example, a wet etch, a dry etch, or a combination of sequential wet and/or dry etches. In some embodiments of the invention, a chemical etchant that attacks the material of the second ILD 122 without substantially reacting to the remaining materials of the hybrid stacked semiconductor device 100 can be performed to form the gate contact trenches 140 and 141.

Figure 13:
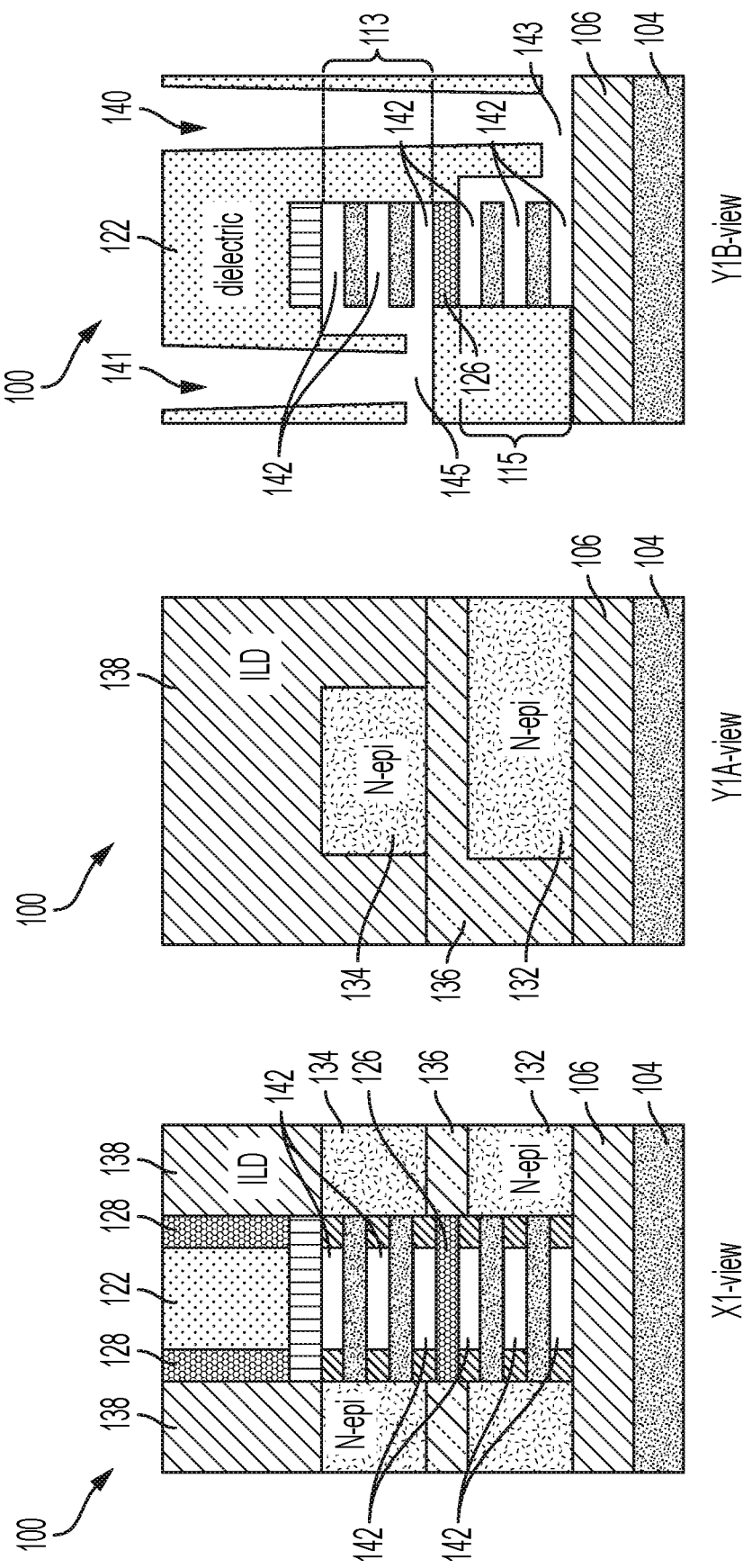

Turning now to FIG. 13, the hybrid stacked semiconductor device 100 is illustrated after removing the sacrificial layers 110 from the NS stack 102. In one or more embodiments of the invention, the sacrificial layers 110 can be selectively removed using a wet or dry etch process that employs a chemical etchant that attacks the material of the sacrificial layers 110 without substantially reacting to the remaining materials of the hybrid stacked semiconductor device 100. Accordingly, the nanosheet channels of the top and bottom NS stacks 113 and 115 (e.g., the semiconductor layers 108 in the channel region 107) are "released," and channel voids 142 are formed in the NS stack 102.

In some embodiments of the invention, the selective removal of the sacrificial layers 110 also includes removing the top gate extension 117 and the bottom gate extension 120 when they are formed from the same material as the sacrificial layers 110. Accordingly, a bottom contact extension trench 143 and a top contact extension trench 145 are formed in the second ILD 122. The bottom contact extension trench 143 extends laterally from the first contact trench 140 and exposes the sidewall of the bottom NS stack 225. Likewise, the top contact extension trench 145 extends laterally from the second contact trench 141 and exposes the sidewall of the top NS stack 115.

Figure 14:
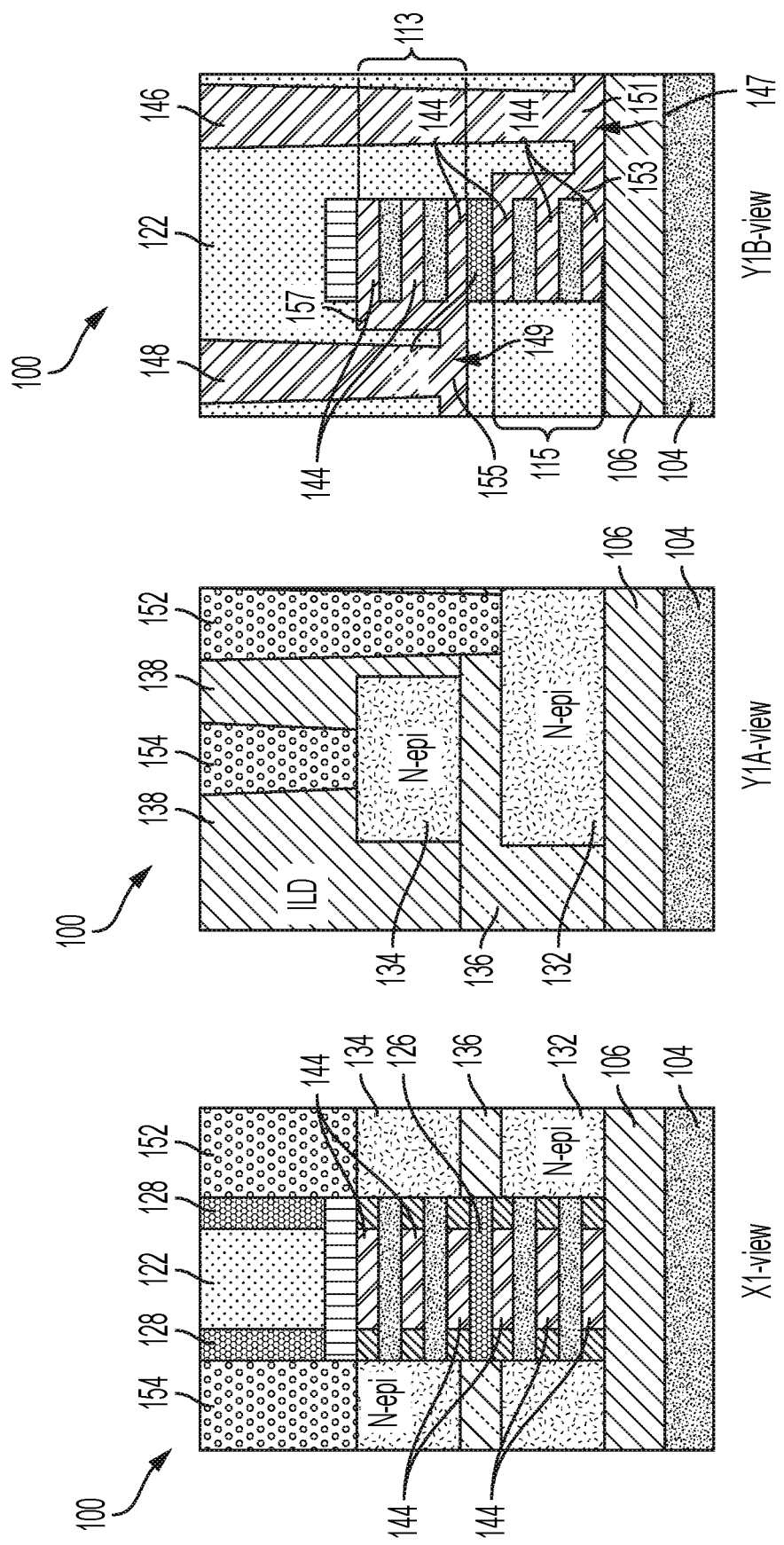

Referring to FIG. 14, the hybrid stacked semiconductor device 100 is illustrated after filling the channel voids 142 with a high-k metal gate material to form an all-around gate 144 that wraps around the semiconductor layers 108 (i.e., channels 108) included in the NS stack 102. The gate 144 can be formed according to known replacement gate (RMG) processes, or so-called gate-last processes. For example, the gate 144 can be formed by selectively removing the sacrificial layers 110 to release the semiconductor layers 108 as described above, and then depositing the high-k metal gate material in the channel voids 142.

In one or more embodiments of the invention, the high-k metal gate material can include a layer of high-k dielectric layer and a workfunction metal (WFM) layer. Examples of high-k dielectric include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric can further include dopants such as lanthanum and aluminum.

In some embodiments of the invention, the high-k dielectric film can have a thickness of about 0.5 nm to about 4 nm. In some embodiments of the invention, the high-k dielectric film includes hafnium oxide and has a thickness of about 1 nm, although other thicknesses are within the contemplated scope of the invention.

In some embodiments of the invention, the gate 144 includes one or more work function layers (sometimes referred to as a work function metal stack) formed between the high-k dielectric film and a bulk gate material. In some embodiments of the invention, the gate 144 includes one or more work function layers, but do not include a bulk gate material.

If present, the work function layers can be made of, for example, aluminum, strontium titanate, strontium oxide, titanium nitride, tantalum nitride, hafnium nitride, tungsten nitride, molybdenum nitride, niobium nitride, titanium aluminum nitride, tantalum silicon nitride, titanium aluminum carbide, tantalum carbide, titanium carbide, and combinations thereof. The work function layer can serve to modify the work function of the gate 144 and enables tuning of the device threshold voltage. The work function layers can be formed to a thickness of about 0.5 to 6 nm, although other thicknesses are within the contemplated scope of the invention. In some embodiments of the invention, each of the work function layers can be formed to a different thickness. In some embodiments of the invention, the work function layers include a TiN/TiC/TiCAl stack.

In some embodiments of the invention, the gate 144 includes a main body formed from bulk conductive gate material(s) deposited over the work function layers and/or gate dielectrics. The bulk gate material can include any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), conductive carbon, graphene, or any suitable combination of these materials. The conductive gate material can further include dopants that are incorporated during or after deposition.

With continued reference to FIG. 14, the first and second gate contact trenches 140 and 141 along with the bottom and top contact extension trenches 143 and 145 are filled with an electrically conductive material to form a first gate contact 146 and corresponding bottom gate extension 147, along with a second gate contact 148 and a corresponding top gate extension 149. The electrically conductive material can be the same as the material used to form the all-around gate 144. In some embodiments of the invention, the gate contact material overfills the gate contact trenches 140 and 141, which form overburdens that can be removed using, for example, a CMP process.

As shown in FIG. 14, the bottom gate extension 147 includes a base portion 151 and a side portion 153. The base portion 151 is formed on the substrate 104 (e.g., the upper surface of the oxide layer 106) and extends from the sidewall of the bottom NS stack 115 in a first direction. The side portion 153 extends upwards from the base portion 151 and lines the side of the bottom NS stack 115, thereby by establishing contact with the portion of the gate 144 located in the bottom NS stack 115. The top gate extension 149 includes a base portion 155 that extends from a sidewall of the top NS stack 113 in a second direction that is opposite the first direction of the bottom base portion 151. The side portion 157 extends upwards from the base portion 155 and lines the side of the top NS stack 113, thereby by establishing contact with a portion of the gates 144 included in the top NS stack 113.

As described herein, the opposing orientations of the bottom and top base portions 151 and 155 of the bottom and top gate extensions 147 and 149, respectively, facilitate the separation and isolation of the first gate contact 146 from the second gate contact 148. For instance, the first gate contact 146 extends through the ILD 122 and contacts the base portion 151. Accordingly, the bottom gate extension 147 establishes conductivity between the first gate contact 146 and the gate 144, and therefore can be used to control the bottom NS stack 115. Likewise, the second gate contact 148 extends through the ILD 122 and contacts the top base portion 155. Accordingly, the top gate extension establishes conductivity between the second gate contact 148 and the gate 144, and therefore can be used to control the top NS stack 113 independently from the bottom NS stack 115.

Still referring to FIG. 14, first and second S/D contacts 152 and 154 are formed to establish conductivity to the first and second S/Ds 132 and 134. The first and second S/D contacts 152 and 154 can be formed by performing known patterning and etching techniques. For example, S/D gate contact trenches (not shown) can be patterned using lithography followed by etching to expose the upper surfaces of the first and second S/D 132 and 134. Any known method can be used for etching the pattern of the S/D contact trenches 154 and 151 into the ILD 138 and 136, such as, for example, a wet etch, a dry etch, or a combination of sequential wet and/or dry etches. In some embodiments of the invention, a RIE process that attacks the material of the ILD 136 and 138 without substantially reacting to the remaining materials of the hybrid stacked semiconductor device 100 can be performed to form the S/D contact trenches. The S/D contact trenches can then be filled with a conductive material such as copper (Cu) or tungsten (W), Co, Ru for example, to establish contact with the first S/D 132 and the second S/D 134. Prior to the contact metal fill, a silicide liner, such as Ti, Ni. NiPt is deposited over the S/D epi, followed by an adhesion metal layer deposition, such as TiN In some embodiments of the invention, a CMP process can be subsequently so that the first and second S/D contacts 152 and 154 are co-planar (i.e., flush) with the sidewall spacers 128 and the ILD 122.

As shown in FIG. 14, a completed hybrid stacked semiconductor device 100 is provided. The hybrid stacked semiconductor device 100 includes a top NS stack 113 arranged above (i.e., stacked) a bottom NS stack 115, where the bottom NS stack 115 can be controlled using a first gate contact 146 and the top NS stack 113 can be controlled using a second gate contact 148 independently from the first gate contact 146. Although the completed hybrid stacked semiconductor device 100 is shown as including a pair of stacked NFETs having independently controlled gates, it should be appreciated that the fabrication operations described above can be employed to provide a hybrid stacked semiconductor device 100 having different transistor stack arrangements including, but not limited to, a pair of stacked PFETs having independently controlled gates or a stacked CMOS FET (e.g., an NFET stacked over a PFET, and vice versa) having independently controlled gates.

With reference now to FIGS. 15-19, a series of fabrication operations is illustrated for forming a hybrid stacked semiconductor device including stacked FETs having a shared gate (i.e., a commonly controlled gate) that is shared by the stacked FETS. It should be appreciated that one or more of the fabrication operations described with reference to FIGS. 2-14 can also be applied when forming the hybrid stacked semiconductor device including stacked FETs having a shared gate. Therefore, these details will not be repeated for the sake of brevity.

Figure 15:
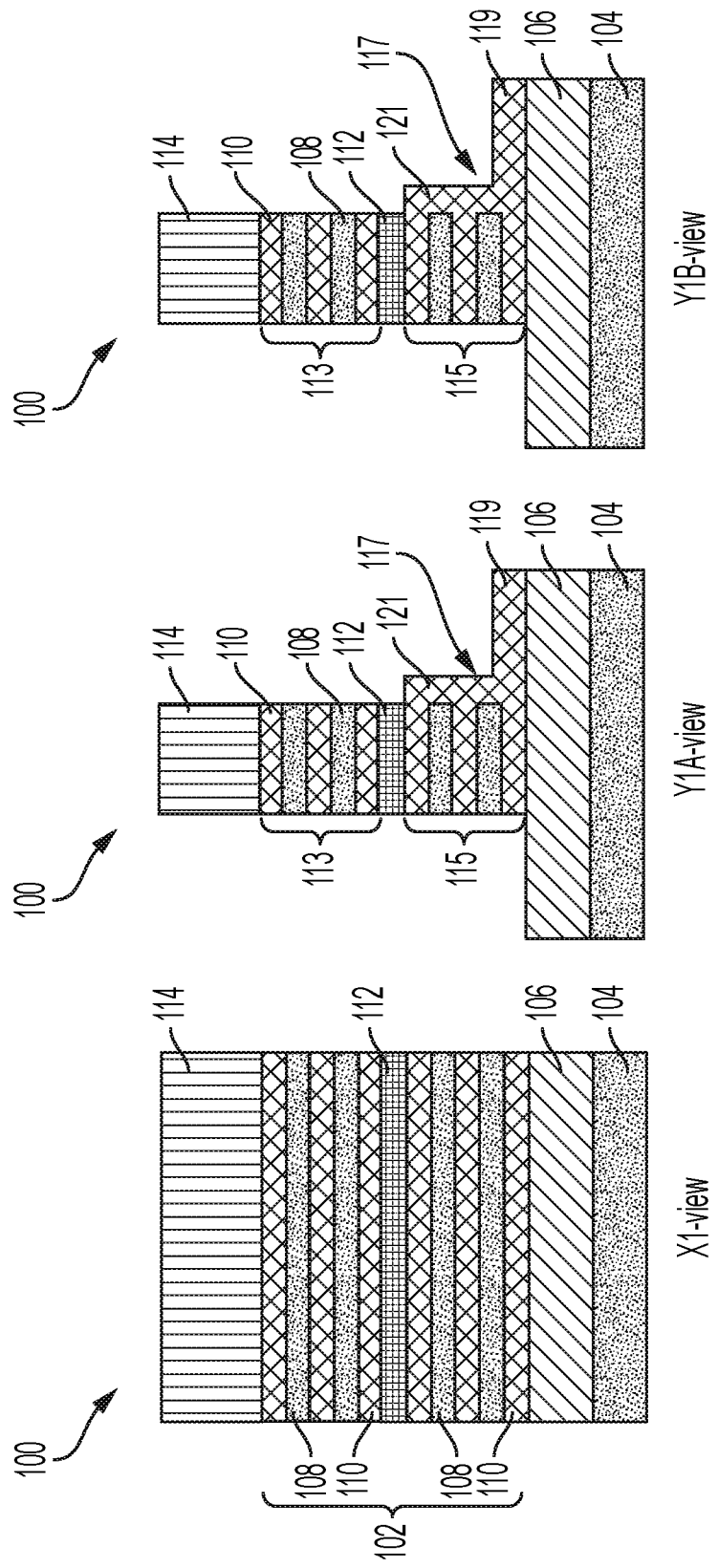

Referring to FIG. 15, a hybrid stacked semiconductor device 100 is illustrated after performing various known intermediate fabrication operations in accordance with aspects of the present invention. At this stage of the process flow, the hybrid stacked semiconductor device 100 is illustrated after forming a first gate extension 117 (i.e., a bottom gate extension 117). As shown in FIG. 15, the bottom gate extension 117 is present in the active region 105 (as shown in view-Y1A) and 107 (as shown in view Y1B). The bottom gate extension 117 includes a base portion 119 and a side portion 121. The base portion 119 is formed on the substrate 104 (e.g., the upper surface of the oxide layer 106) and extends from a sidewall of the bottom NS stack 115 in a first direction. The side portion 121 extends upwards from the base portion 119 and lines the side of the bottom NS stack 115. Although the aforementioned example forms the bottom gate extension 117 on the right side of the bottom NS stack 115, it should be appreciated that the bottom gate extension 117 can be formed on left side of the bottom NS stack 115 without departing from the scope of the invention.

Figure 16:
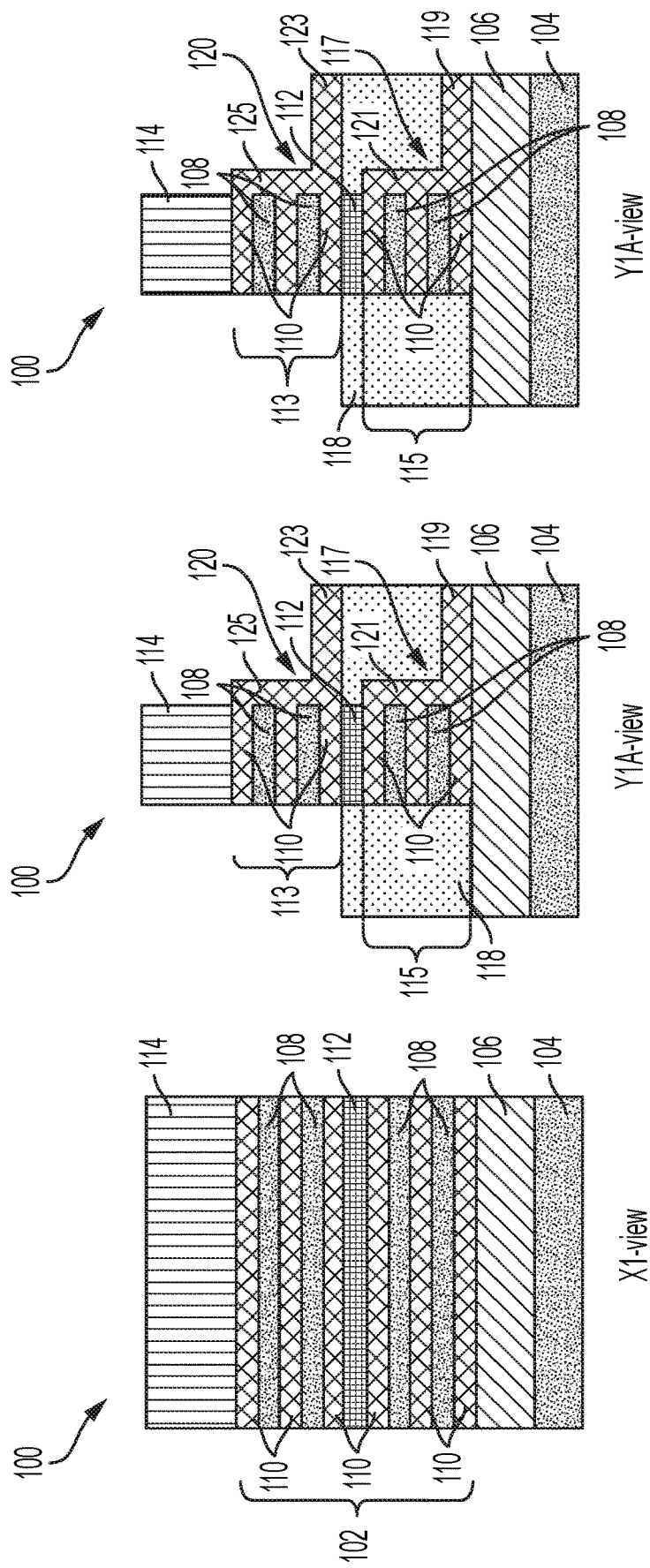

Turning to FIG. 16, the hybrid stacked semiconductor device 100 is illustrated after forming a second gate extension 120 (i.e., a top gate extension 120). Unlike the hybrid stacked semiconductor device 100 described with reference to FIGS. 2-14 above, the top gate extension 120 illustrated in FIG. 16 is formed on the same side of the NS stack 102 as the bottom gate extension 117 rather than the opposite side of the NS stack 102, and has an orientation that substantially matches that of the bottom gate extension rather than an opposite orientation (e.g., shown in FIG. 3). Accordingly, the bottom and top gate extensions 117 and 120 can facilitate formation of a shared gate (i.e., a commonly controlled gate) that is shared by stacked FETS included in the completed hybrid stacked semiconductor device 100 (see FIG. 19).

As shown in FIG. 16, the top gate extension 120 is present in the active region 105 (as shown in view-Y1A) and 107 (as shown in view Y1B). The top gate extension 120 includes a base portion 123 that is formed on an upper surface of the ILD 118 and extends from the sidewall of the top NS stack 113 in the first direction, i.e., the same direction as the bottom base portion 119. The side portion 125 extends upwards from the top base portion 123 and lines the side of the top NS stack 113. Accordingly, the top base portion 123 is positioned directly above the bottom base portion 119.

Figure 17:
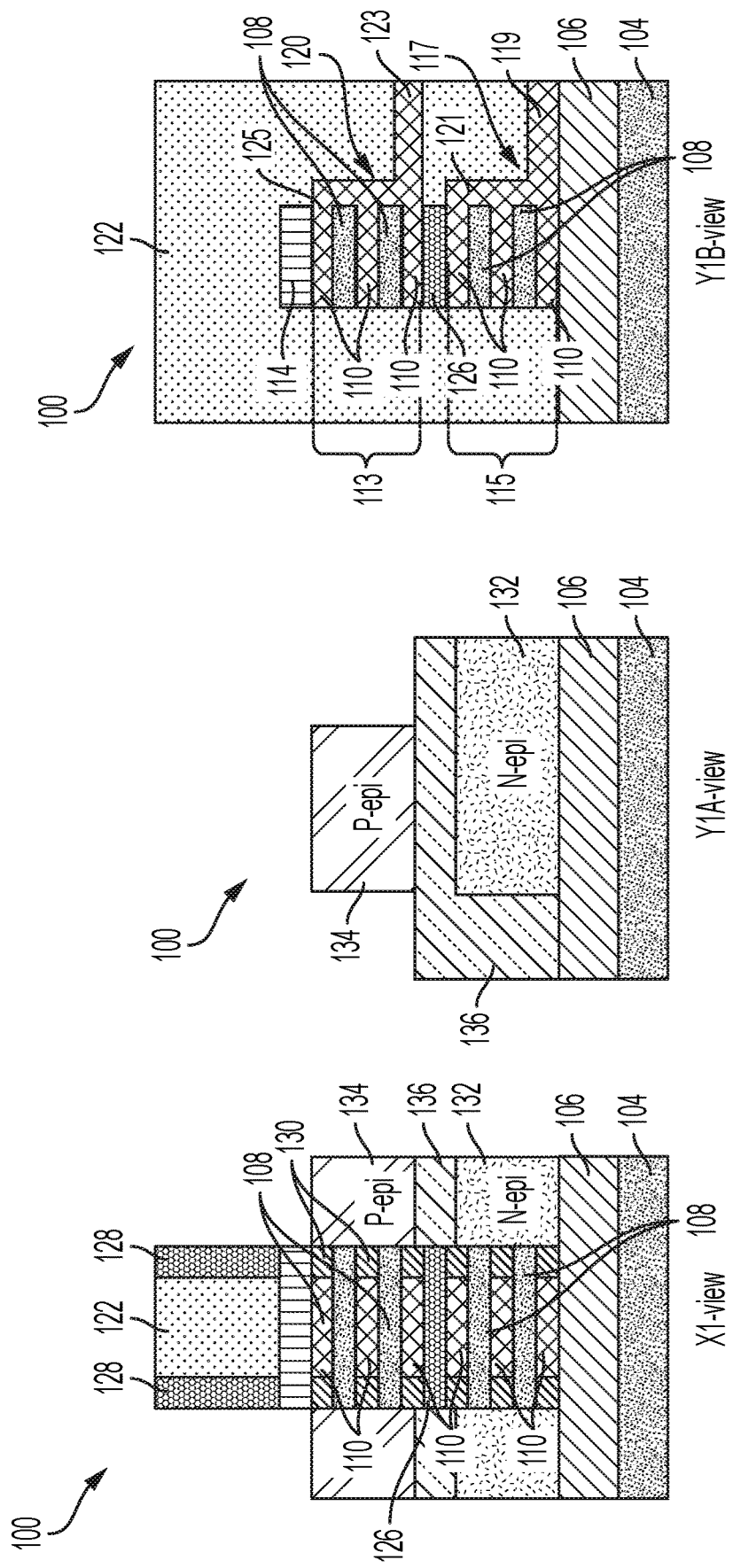

Referring now to FIG. 17, the hybrid stacked semiconductor device 100 is illustrated after forming a first source/drain 132 (e.g., a bottom S/D 132) corresponding to the bottom NS stack 115 and a second S/D 134 (e.g., a top S/D 134) corresponding to the top NS stack 113. An isolation dielectric 136 separates and electrically isolates the bottom S/D 132 from the top S/D 134.

Figure 19:
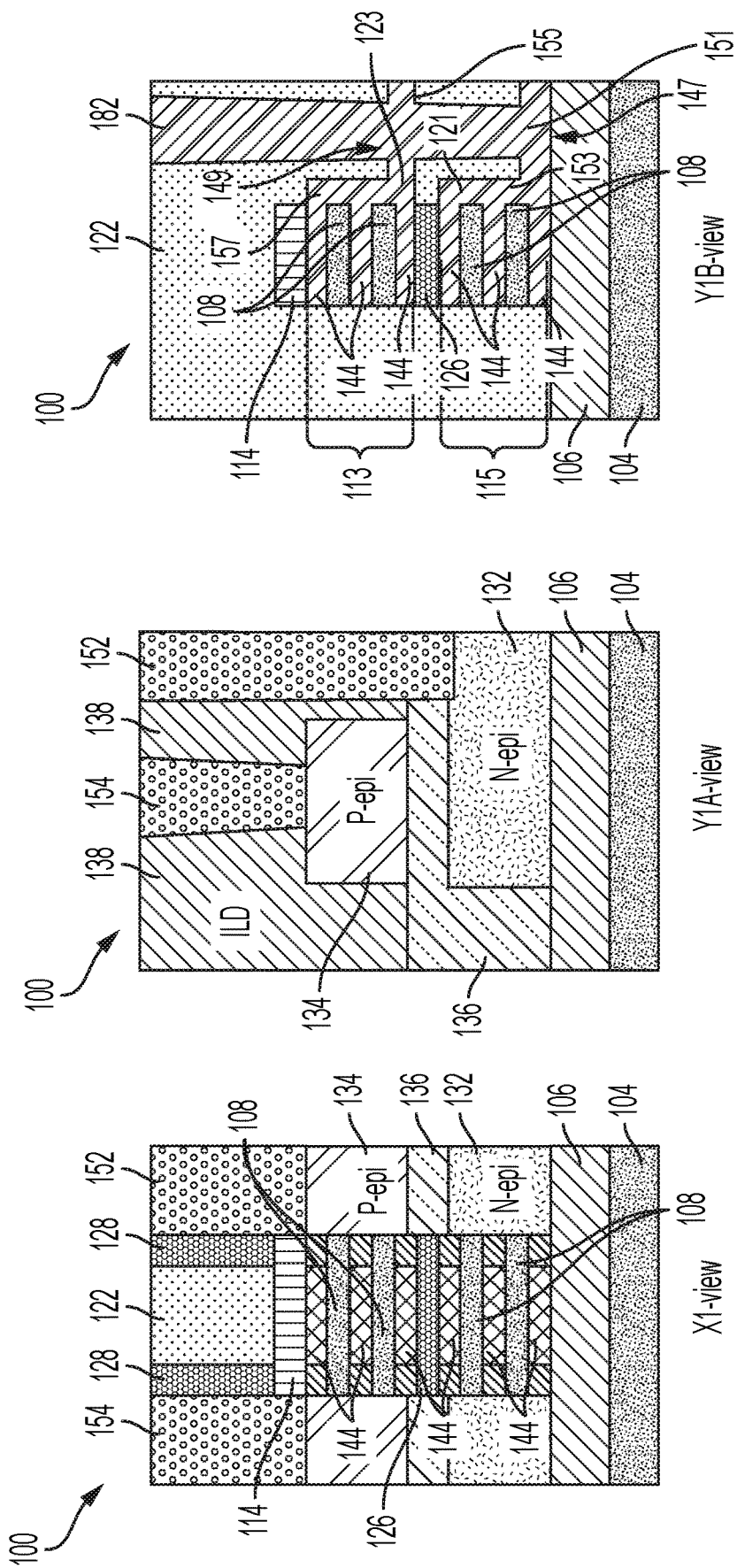

In this example, the bottom NS stack 115 is formed from an n-type semiconductor type material while the top S/D 134 is formed from a p-type semiconductor material so as to facilitate a completed hybrid stacked semiconductor device 100 including a stacked CMOS (e.g., a PFET stacked on an NFET) having a shared gate contact 170 (see FIG. 19). It should be appreciated, however, that other stacked arrangements can be provided according the fabrication methods of the present invention described herein. In some embodiments of the invention, for example, the bottom NS stack 115 is formed from a p-type semiconductor type material while the top S/D 134 is formed from an n-type semiconductor material so as to facilitate a completed hybrid stacked semiconductor device 100 including a different arranged stacked CMOS having a shared gate contact 170. In some embodiments of the invention, the bottom S/D 132 and the top S/D 134 can be formed of the same material to provide a hybrid stacked semiconductor device 100 having same type FETs that share a gate.

Figure 18:
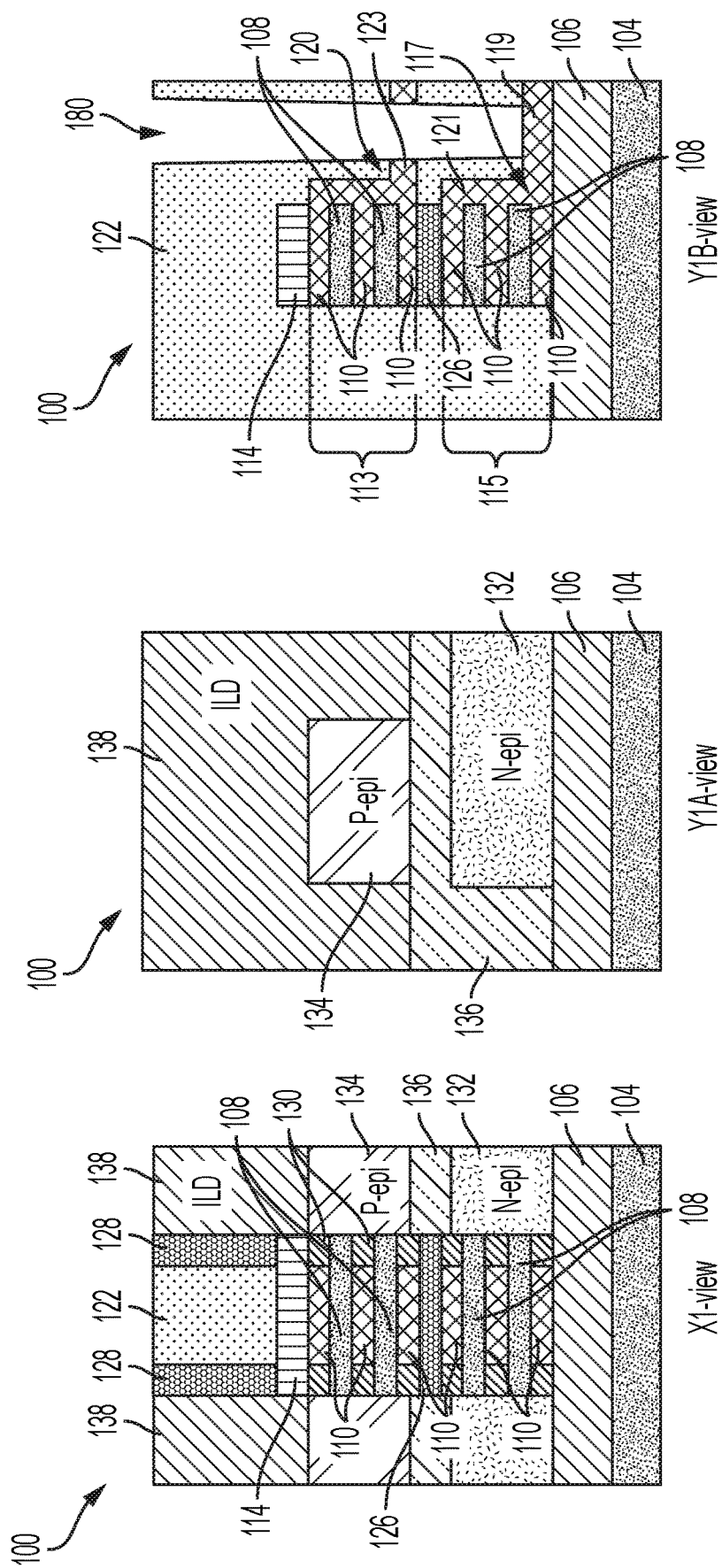

Turning to FIG. 18, the hybrid stacked semiconductor device 100 is illustrated after forming a shared gate contact trench 180 in an ILD 122. As described herein, the shared gate contact trench 180 can be patterned using lithography followed by etching the pattern through the ILD 122 and the base portion 123 of the top gate extension 120 until exposing the base portion 119 of the bottom gate extension 117. Any known method can be used for etching the pattern of the gate contact trenches 140 and 141 into the second ILD 122, such as, for example, a wet etch, a dry etch, or a combination of sequential wet and/or dry etches.

With reference to FIG. 19, the hybrid stacked semiconductor device 100 is illustrated after replacing the sacrificial layers 110 and filling the shared gate contact trench 180 with a high-k metal gate material to form top and bottom gate extensions 147 and 149 that establish connection with a shared gate contact 182.

The bottom gate extension 147 includes a base portion 151 and a side portion 153. The base portion 151 is formed on the substrate 104 (e.g., the upper surface of the oxide layer 106) and extends from a side of the NS stack 102 corresponding to the bottom NS stack 115 in a first direction. The side portion 153 extends upwards from the base portion 151 and lines the sidewall of the bottom NS stack 115, thereby by establishing contact with the portion of the metal all-around gate 144 included in the bottom NS stack 115. The top gate extension 149 includes a base portion 155 that extends from the same side of the NS stack 102 corresponding to the top NS stack 113 and in the same direction as the bottom base portion 151. The side portion 157 extends upwards from the base portion 155 and lines the side of the top NS stack 113, thereby by establishing contact with the portion of the metal all-around gates 144 included in the top NS stack 113.

The matching orientations of the bottom and top base portions 151 and 155 of the bottom and top gate extensions 147 and 149, respectively, facilitate the formation of a shared gate contact 182 the establishes a shared or common connection between the portion of the gate 144 located in the bottom NS stack 115 and the portion of the gate 144 included in the top NS stack 113. In this manner, a hybrid stacked semiconductor device 100 including a stacked CMOS FET (e.g., an NFET stacked over a PFET, and vice versa) having a shared gate can be provided, or a hybrid stacked semiconductor device 40 can include a pair of stacked same type FETs (e.g., stacked NFETs or stacked PFETs) having a shared gate can be provided.

As shown in FIG. 19, a completed hybrid stacked semiconductor device 100 is provided after forming first and second S/D contacts 152 and 154 that contact with the bottom S/D 132 and the top S/D 134, respectively. The hybrid stacked semiconductor device 100 includes a top NS stack 113 arranged above (i.e., stacked) a bottom NS stack 115, where the bottom NS stack 115 and the top NS stack 113 can be controlled using a shared gate contact 170. Although the completed hybrid stacked semiconductor device 100 is shown including a stacked CMOS (e.g., a PFET stacked on an NFET) having a shared gate contact 170, it should be appreciated that the fabrication operations described above can be employed to provide a hybrid stacked semiconductor device 100 having different transistor stack arrangements including, but not limited to, a pair of stacked NFETs having a shared gate, a pair of stacked PFETs having a shared gate, or an NFET stacked over a PFET having a shared gate.

Figure 20:
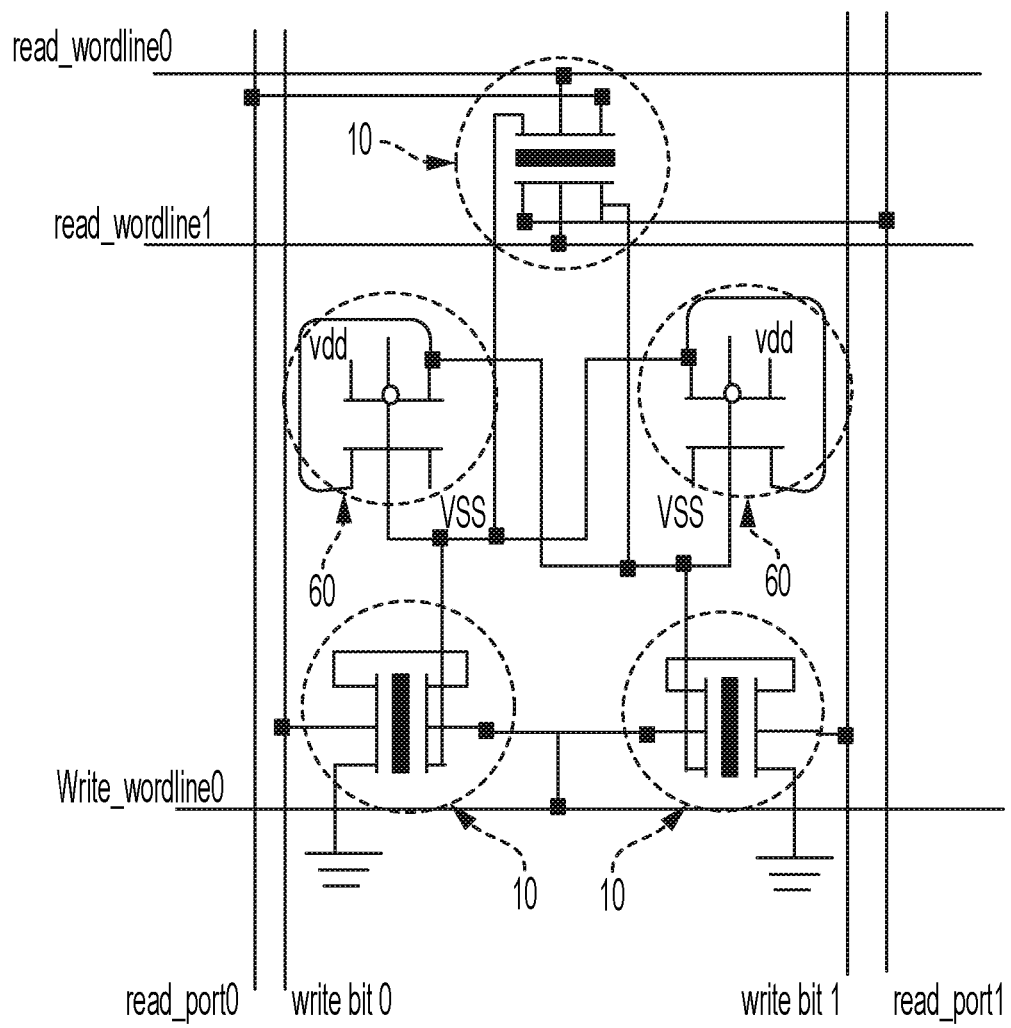
FIG. 20 is a schematic diagram of an integrated circuit (IC) including different types of hybrid stacked semiconductor devices according to an embodiment of the present invention.

Turning now to FIG. 20, an IC 200 including different types of hybrid stacked semiconductor devices is illustrated according to an embodiment of the present invention. As descried herein, the fabrication operations described herein allows for providing different types of hybrid stacked semiconductor devices. Returning to FIG. 1, for example, some embodiments of the present invention provide a hybrid semiconductor device 10 can include pair of stacked NFETs having independently controlled gates. According to another non-limiting embodiment of the present invention, the hybrid stacked semiconductor device 20 can include a pair of stacked PFETs having independently controlled gates. According to yet another non-limiting embodiment of the present invention, the hybrid stacked semiconductor device 30 can include a pair of stacked NFETs having a shared gate. According to still another non-limiting embodiment of the present invention, the hybrid stacked semiconductor device 40 can include a pair of stacked PFETs having a shared gate. According to yet another non-limiting embodiment of the present invention, the hybrid stacked semiconductor device 50 can include a stacked CMOS FET (e.g., an NFET stacked over a PFET, and vice versa) having independently controlled gates. According to still another non-limiting embodiment of the present invention, the hybrid stacked semiconductor device 60 can include a stacked CMOS FET (e.g., an NFET stacked over a PFET, and vice versa) having a shared gate.

As shown in FIG. 20, the IC 200 can include, for example, a local register file (LRF) implemented in an AI hardware accelerator. The IC 200 includes several hybrid stacked semiconductor devices with different types of stacked FETs and gate arrangements. For example, the IC 200 includes a collection of hybrid stacked semiconductor devices 10 that include a pair of stacked NFETs having independently controlled gates, along with a collection of hybrid stacked semiconductor device 60 that include a stacked CMOS FET (e.g., an NFET stacked over a PFET, and vice versa) having a shared gate. Accordingly, the hybrid stacked semiconductor devices according to embodiments of the present invention can be utilized in wider range of applications compared to conventional CFE.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e., one, two, three, four, etc. The terms "a plurality" are understood to include any integer number greater than or equal to two, i.e., two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a hybrid stacked semiconductor device, the method comprising:
   forming a nanosheet stack on a substrate, the nanosheet stack comprising a first stack portion including first channels, a second stack portion stacked on the first stack portion, the second stack portion including second channels, and a dielectric spacer interposed between the first stack portion and the second stack portion;
   forming an all-around gate including a first gate portion that wraps around the first channels and a second gate portion that wraps around the second channels;
   forming a first gate extension on a first side of the nanosheet stack to contact the first gate portion;
   forming a second gate extension on a second side of the nanosheet stack to contact the second gate portion, the second side being different from the first side;
   removing portions of the first and second gate extensions from an active region of the substrate;
   removing a portion of the nanosheet stack from the active area to expose a portion of the substrate;
   forming a first source/drain directly on the exposed portion of the substrate, the first source/drain contacting the first channels included in the first stack portion of the nanosheet stack;
   covering the first source/drain with an isolation dielectric;
   forming a second source/drain on the isolation dielectric, the second source/drain contacting the second channels included in the second stack portion of the nanosheet stack;
   forming a first gate contact that contacts the first gate extension to establish conductivity with the first gate portion; and
   forming a second gate contact that contacts the second gate extension to establish conductivity with the second gate portion.

2. The method of claim 1 further comprising forming a first source/drain to contact the first stack portion and forming a second source/drain to contact the second stack portion.

3. The method of claim 2 further comprising doping the first source/drain with a first dopant and doping the second source/drain with a second dopant that is the same as the first dopant.

4. The method of claim 2 further comprising doping the first source/drain with a first dopant and doping the second source/drain with a second dopant that is different than the first dopant.

5. The method of claim 1, wherein forming the first and second gate extensions comprise:
   forming a first sidewall portion that contacts the first gate portion and forming a first base extending from the first sidewall portion along a first direction to define the first gate extension; and
   forming a second sidewall portion that contacts the second gate portion and forming a second base extending from the second sidewall portion along a second direction different from the first direction.

6. The method of claim 5, wherein the first gate contact physically contacts a first base portion of the first base and the second gate contact physically contacts a second base portion of the second base.

7. The method of claim 6, wherein forming the first and second gate extensions further comprises:
   forming a first gate extension layer in a first dielectric material, the first gate extension layer including the first base portion formed directly on the substrate and the first sidewall portion formed directly against the first stack portion;
   forming a second gate extension layer in a second dielectric material, the second gate extension layer including the second base portion formed on an upper surface of the first dielectric material and the second sidewall portion formed directly against the second stack portion;
   replacing the first gate extension layer with a first electrically conductive material to form the first gate extension; and
   replacing the second gate extension layer with a second electrically conductive material to form the second gate extension.

8. A hybrid stacked semiconductor device comprising:
   a nanosheet stack on a substrate, the nanosheet stack comprising a first stack portion including first channels, a second stack portion stacked on the first stack portion, the second stack portion including second channels, and a dielectric spacer interposed between the first stack portion and the second stack portion;
   an all-around gate including a first gate portion that wraps around the first channels and a second gate portion that wraps around the second channels;
   a first gate extension contacting the first gate portion, the first gate extension including a first base portion extending laterally from the first gate portion in a first direction;
   a second gate extension contacting the second gate portion, the second gate extension including a second base portion disposed entirely above the first base portion and extending laterally from the second gate portion in a second direction opposite the first direction; and
   at least one gate contact contacting the first gate extension to establish conductivity with the first gate portion and contacting the second gate extension to establish conductivity with the second gate portion.

9. The hybrid stacked semiconductor device of claim 8, wherein the first gate extension contacts a first side of the nanosheet stack, and wherein the at least one gate contact includes a first gate contact that contacts the first gate extension; and
   wherein the second gate extension contacts a second side of the nanosheet stack opposite the first side, and wherein the at least one gate contact includes a second gate contact that contacts the second gate extension.

10. The hybrid stacked semiconductor device of claim 9, wherein the first stack portion includes first channels doped with a first dopant to form a first type of transistor and the second stack portion includes second channels doped with a second dopant different from the first type of dopants to form a second type of transistor different from the first type of transistor.

11. The hybrid stacked semiconductor device of claim 8, further comprising a first gate contact that contacts the first base portion of the first gate extension, and a second gate contact that contacts the second base portion of the second gate extension, wherein the first gate contact extends below the second base portion and the second gate portion.

* * * * *